(12) United States Patent
Kim et al.

(10) Patent No.: US 12,344,013 B2
(45) Date of Patent: Jul. 1, 2025

(54) INKJET PRINTING APPARATUS

(71) Applicant: Samsung Display Co., LTD., Yongin-si (KR)

(72) Inventors: Kyong Sub Kim, Hwaseong-si (KR); Sung Ho Park, Cheonan-si (KR); Jae Won Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 183 days.

(21) Appl. No.: 18/102,116

(22) Filed: Jan. 27, 2023

(65) Prior Publication Data
US 2023/0256759 A1   Aug. 17, 2023

(30) Foreign Application Priority Data
Feb. 14, 2022   (KR) ................. 10-2022-0018741

(51) Int. Cl.
  *B41J 29/393*   (2006.01)
  *B41J 2/175*    (2006.01)
  *B41J 29/377*   (2006.01)

(52) U.S. Cl.
  CPC ......... *B41J 29/393* (2013.01); *B41J 2/17523* (2013.01); *B41J 29/377* (2013.01)

(58) Field of Classification Search
  CPC .... B41J 29/393; B41J 2/17523; B41J 29/377; B41J 2202/09; B41J 2/18; B41J 2/195; B41J 2/3358; B41J 2/175; B41J 2/17; B41J 3/4073; B41J 2/04501; B41J 2/04563; B41J 2/14; B41J 2/1721; H10K 71/135
  See application file for complete search history.

(56) References Cited

U.S. PATENT DOCUMENTS

2009/0015619 A1   1/2009  Chang et al.
2009/0160899 A1   6/2009  Okada
(Continued)

FOREIGN PATENT DOCUMENTS

CN   1202423        12/1998
JP   2011207064 A * 10/2011
WO   2022-005034    1/2022

OTHER PUBLICATIONS

Extended European Search Report for European Patent Application No. 23156185.3, dated Jun. 26, 2023.

*Primary Examiner* — Justin Seo
*Assistant Examiner* — Tracey M McMillion
(74) *Attorney, Agent, or Firm* — KILE PARK REED & HOUTTEMAN PLLC

(57) ABSTRACT

An inkjet printing apparatus includes: a stage on which a substrate is disposed; an inkjet head disposed above the stage and spraying ink on the substrate; an ink storage that stores the ink; a first link pipe connecting the ink storage and the inkjet head and supplying the ink from the ink storage to the inkjet head; a second link pipe connecting the ink storage and the inkjet head and collecting a portion of the ink from the inkjet head to the ink storage; and a temperature controller including a cooler and a heater disposed respectively in opposite sides thereof. The portion of the ink remains in the inkjet head after the ink is ejected from the inkjet head on the substrate, the first link pipe is disposed on the heater of the temperature controller, and the second link pipe is disposed on the cooler of the temperature controller.

20 Claims, 24 Drawing Sheets

(56) References Cited

U.S. PATENT DOCUMENTS

| | | | |
|---|---|---|---|
| 2011/0025751 A1* | 2/2011 | Hashi | B41J 2/175 347/17 |
| 2011/0069118 A1* | 3/2011 | Ohzeki | B41J 2/14233 347/44 |
| 2012/0105520 A1 | 5/2012 | Shimoda et al. | |
| 2021/0023838 A1* | 1/2021 | Saito | B41J 29/377 |

* cited by examiner

INKJET PRINTING APPARATUS

CROSS-REFERENCE TO RELATED APPLICATION(S)

This application claims priority to and benefits of Korean Patent Application No. 10-2022-0018741 under 35 U.S.C. § 119, filed on Feb. 14, 2022, in the Korean Intellectual Property Office (KIPO), the entire contents of which are incorporated herein by reference.

BACKGROUND

1. Technical Field

Embodiments relate to an inkjet printing apparatus.

2. Description of Related Art

The importance of display devices has been increased with development of multimedia. In response to this trend, various types of the display devices such as an organic light-emitting display device (OLED), and a liquid crystal display device (LCD) has been developed.

A device for displaying an image in a display device includes a display panel such as an organic light-emitting display panel or a liquid crystal display panel. A light-emitting display panel may include a light-emitting element. For example, a light-emitting diode (LED) as the light-emitting element may include an organic light-emitting diode (OLED), which is formed of an organic material as a fluorescent material, and an inorganic light-emitting diode, which is formed of an inorganic material as a fluorescent material.

The inorganic light-emitting diode, which is formed of an inorganic semiconductor as the fluorescent materials, has durability in a high-temperature environment and has higher blue light efficiency, compared to the organic light-emitting diode.

SUMMARY

Embodiments provide an inkjet printing apparatus capable of ejecting ink containing a uniform number of bipolar elements per unit droplet.

Embodiments also provide an inkjet printing apparatus capable of increasing the number of bipolar elements per unit droplet of ejected ink.

However, embodiments of the disclosure are not limited to those set forth herein. The above and other embodiments will become more apparent to one of ordinary skill in the art to which the disclosure pertains by referencing the detailed description of the disclosure given below.

According to an embodiment, an inkjet printing apparatus may include: a stage on which a substrate is or disposed; an inkjet head disposed above the stage, the inkjet head that sprays ink on the substrate, the ink including solvent and solid particles dispersed in the solvent; an ink storage that stores the ink; a first link pipe connecting the ink storage and the inkjet head to each other, the first link pipe that supplies the ink from the ink storage to the inkjet head; a second link pipe connecting the ink storage and the inkjet head to each other, the second link pipe that collects a portion of the ink from the inkjet head to the ink storage; and a temperature controller including a cooler and a heater disposed respectively in opposite sides thereof, wherein the portion of the ink may remain in the inkjet head after the ink is ejected from the inkjet head on the substrate, the first link pipe is disposed on the heater of the temperature controller, and the second link pipe is disposed on the cooler of the temperature controller.

In an embodiment, a temperature of the inkjet head may be higher than a temperature of the ink storage.

In an embodiment, a viscosity of the solvent of the ink received in the inkjet head may be lower than a viscosity of the solvent of the ink received in the ink storage.

In an embodiment, the first link pipe includes: a first heat-exchange portion disposed on the heater of the temperature controller; a first supplying connection portion connecting the first heat-exchange portion and the ink storage to each other; and a second supplying connection portion connecting the first heat-exchange portion and the inkjet head, wherein a temperature of the ink flowing through the first supplying connection portion may be lower than a temperature of the ink flowing through the second supplying connection portion.

In an embodiment, the second link pipe may include: a second heat-exchange portion disposed on the cooler of the temperature controller; a first collecting connection portion connecting the second heat-exchange portion and the inkjet head to each other; and a second collecting connection portion connecting the second heat-exchange portion and the ink storage to each other, and a temperature of the ink flowing through the first collecting connection portion may be higher than a temperature of the ink flowing through the second collecting connection portion.

In an embodiment, the temperature controller may further include a temperature measuring member disposed on the heater, the temperature measuring member that measures a temperature of the inkjet head.

In an embodiment, the temperature of the ink flowing through the second supplying connection portion of the first link pipe, the temperature of the ink flowing through the first collecting connection portion of the second link pipe, and a temperature of the ink flowing through the inkjet head may be substantially equal to each other.

In an embodiment, a viscosity of the solvent of the ink flowing through the second supplying connection portion of the first link pipe, a viscosity of the solvent of the ink flowing through the first collecting connection portion of the second link pipe, and a viscosity of the solvent of the ink flowing through the inkjet head may be substantially equal to each other.

In an embodiment, the temperature controller may further include a heat source disposed between the cooler and the heater, wherein a temperature adjustment member may be disposed on the heat source.

In an embodiment, the temperature adjustment member disposed in the heat source may include: a cooling plate; a heating plate facing away the cooling plate; a first connection electrode disposed between the cooling plate and the heating plate and being in contact with the cooling plate; a second connection electrode disposed between the cooling plate and the heating plate and being in contact with the heating plate; a P-type thermoelectric semiconductor element disposed between the first connection electrode and the second connection electrode, the P-type thermoelectric semiconductor element that electrically connecting the first connection electrode and the second connection electrode to each other; and an N-type thermoelectric semiconductor element disposed between the first connection electrode and the second connection electrode, and spaced apart from the P-type thermoelectric semiconductor element, the N-type thermoelectric semiconductor element electrically connecting the first connection electrode and the second connection electrode to each other.

In an embodiment, the cooling plate of the temperature adjustment member may be adjacent to the cooler of the temperature controller, wherein the heating plate of the temperature adjustment member may be adjacent to the heater of the temperature controller.

In an embodiment, the temperature adjustment member disposed in the heat source may include: refrigerant; a compressor that compresses the refrigerant; an evaporator that evaporates the refrigerant; and a condenser that condenses the refrigerant.

In an embodiment, the evaporator of the temperature adjustment member may be adjacent to the cooler of the temperature controller, wherein the condenser of the temperature adjustment member may be adjacent to the heater of the temperature controller.

According to an embodiment, an inkjet printing apparatus may include: a stage on which a substrate is or disposed; an inkjet head disposed above the stage, the inkjet head that sprays ink on the substrate, the ink including solvent and solid particles dispersed in the solvent; an ink storage that stores the ink; a temperature controller spaced apart from the inkjet head and the ink storage, the temperature controller that controls a temperature of the ink; a first link pipe disposed at a first side of the temperature controller and connecting the ink storage and the inkjet head to each other, the temperature controller that supplies the ink from the ink storage to the inkjet head; and a second link pipe disposed at a second side of the temperature controller, the second link pipe that connects the ink storage and the inkjet head to each other and collects a portion of the ink from the inkjet head to the ink storage, wherein the portion of the ink may remain in the inkjet head after the ink is ejected from the inkjet head on the substrate.

In an embodiment, the temperature controller may be disposed closer to the inkjet head than to the ink storage.

In an embodiment, the first link pipe may include: a first heat-exchange portion disposed on the first side of the temperature controller; a first supplying connection portion connecting the first heat-exchange portion and the temperature controller to each other; and a second supplying connection portion connecting the first heat-exchange portion and the inkjet head to each other, wherein a length of the first supplying connection portion may be longer than a length of the second supplying connection portion.

In an embodiment, the second link pipe may include: a second heat-exchange portion disposed on the second side of the temperature controller; a first collecting connection portion connecting the second heat-exchange portion and the inkjet head to each other; and a second collecting connection portion connecting the second heat-exchange portion and the temperature controller to each other, and a length of the first collecting connection portion may be longer than a length of the second collecting connection portion.

In an embodiment, the first side of the temperature controller may function to increase the temperature of the ink, in case that the second side of the temperature controller may function to decrease the temperature of the ink, wherein a length of the second supplying connection portion may be smaller than a length of the first collecting connection portion.

In an embodiment, the temperature controller may include: a cooling plate forming the second side of the temperature controller; a heating plate forming the first side of the temperature controller and facing away the cooling plate; a first connection electrode disposed between the cooling plate and the heating plate and being in contact with the cooling plate; a second connection electrode disposed between the cooling plate and the heating plate and being in contact with the heating plate; a P-type thermoelectric semiconductor element disposed between the first connection electrode and the second connection electrode, the P-type thermoelectric semiconductor element electrically connecting the first connection electrode and the second connection electrode to each other; and an N-type thermoelectric semiconductor element disposed between the first connection electrode and the second connection electrode, and spaced apart from the P-type thermoelectric semiconductor element, the N-type thermoelectric semiconductor element electrically connecting the first connection electrode and the second connection electrode to each other.

In an embodiment, the temperature controller may include: refrigerant; a compressor that compresses the refrigerant; a condenser forming the first side of the temperature controller, the condenser that condenses the compressed refrigerant from the compressor; and an evaporator forming the second side of the temperature controller, the evaporator that evaporates the condensed refrigerant from the condenser.

The inkjet printing apparatus according to an embodiment may eject the ink containing a uniform number of bipolar elements per unit droplet.

The inkjet printing apparatus according to an embodiment may increase the number of bipolar elements per unit droplet of ejected ink.

Effects according to the embodiments are not limited to that as described above, and further various effects are included herein.

BRIEF DESCRIPTION OF DRAWINGS

The above and other aspects and features of the disclosure will become more apparent by describing in detail embodiments thereof with reference to the attached drawings, in which.

DETAILED DESCRIPTIONS OF THE EMBODIMENTS

Figure 1:
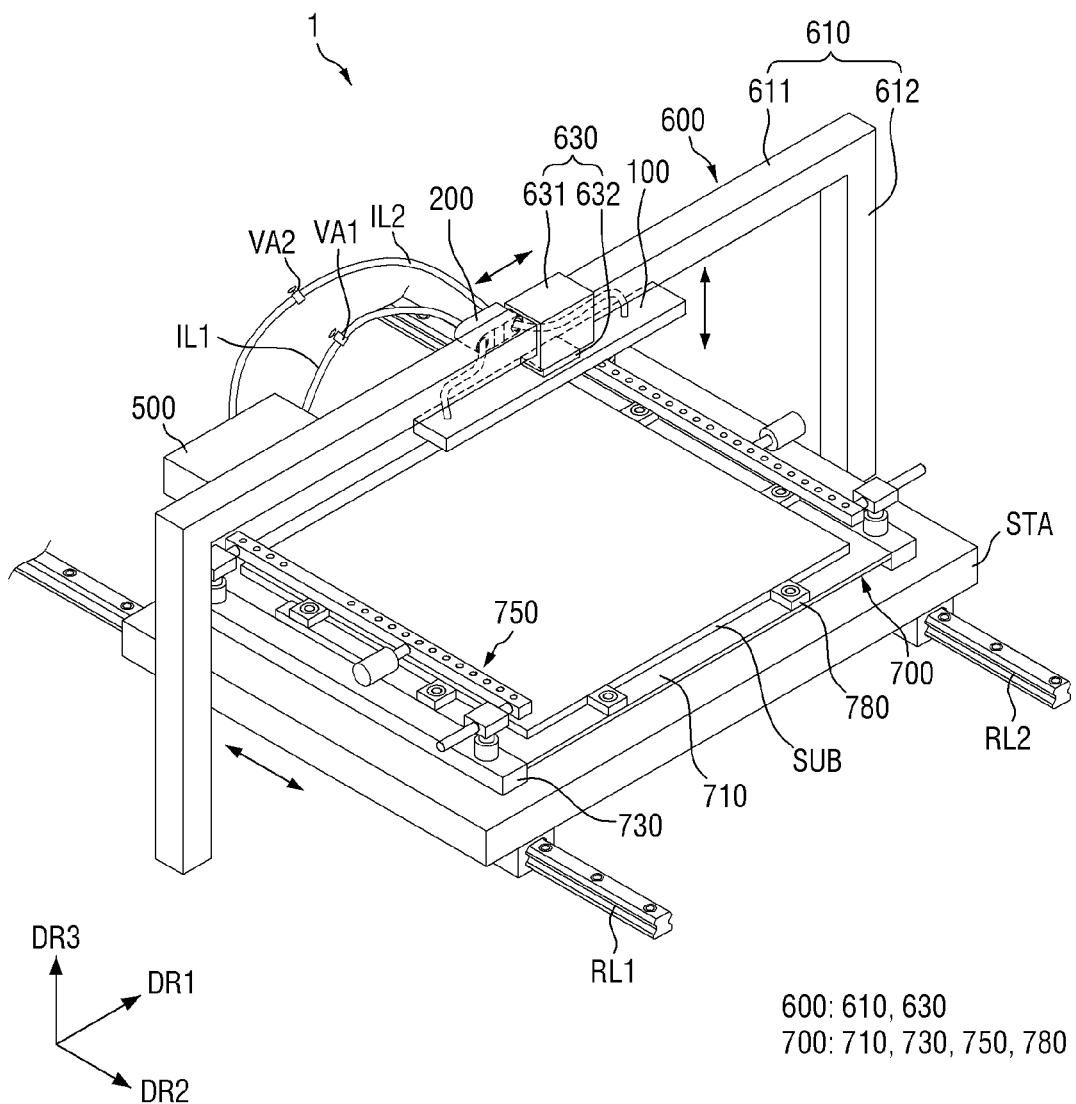
FIG. 1 is a schematic perspective view showing an inkjet printing apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments will be described with reference to the accompanying drawings.

Figure 2:
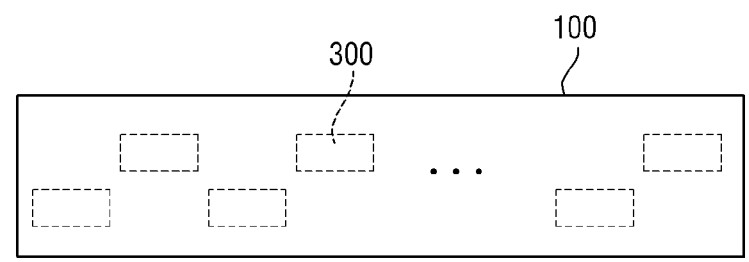
FIG. 2 is a schematic plan view of an inkjet head of the inkjet printing apparatus according to the embodiment of FIG. 1 as viewed in a third direction.
Figure 2:
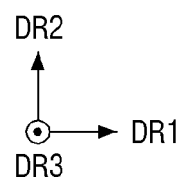
Figure 3:
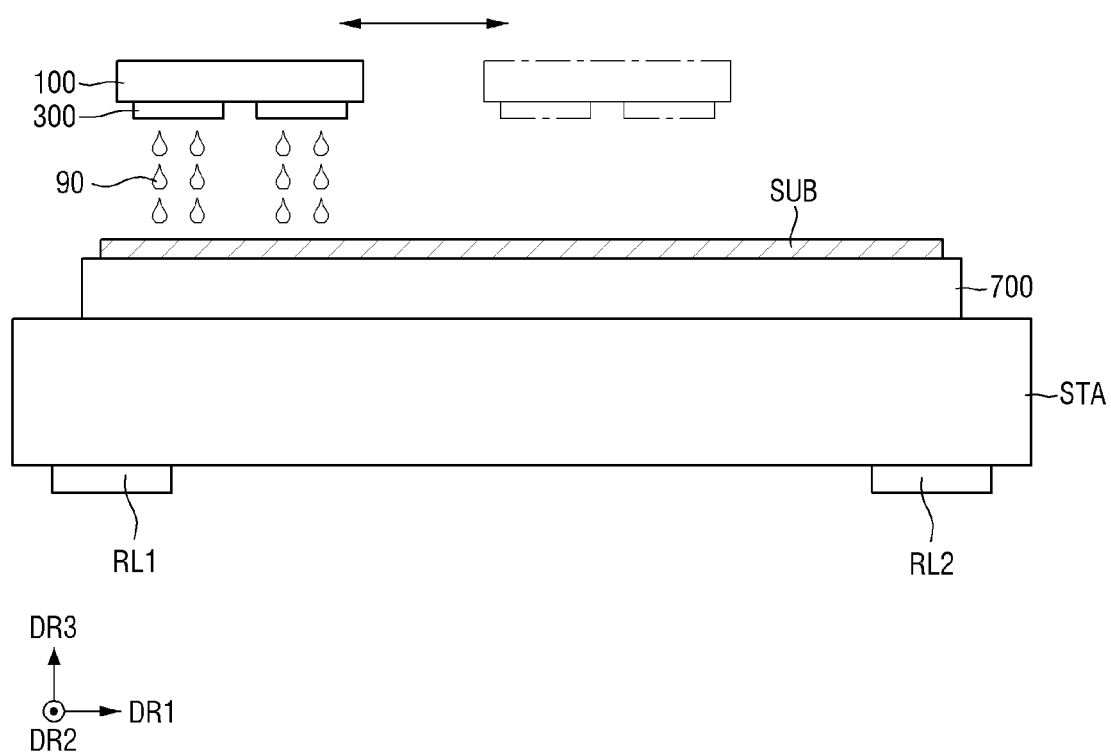
FIG. 3 is a schematic diagram showing an operation of the inkjet head of the inkjet printing apparatus according to the embodiment of FIG. 1.

FIG. 1 is a schematic perspective view showing an inkjet printing apparatus according to an embodiment. FIG. 2 is a schematic plan view of an inkjet head of the inkjet printing apparatus according to the embodiment of FIG. 1 as viewed in a third direction DR3. FIG. 3 is a schematic diagram showing an operation of the inkjet head of the inkjet printing apparatus according to the embodiment of FIG. 1.

In FIG. 1, a first direction DR1, a second direction DR2, and a third direction DR3 are defined. The first direction DR1 and the second direction DR2 may be perpendicular to each other. The first direction DR1 and the third direction DR3 may be perpendicular to each other. The second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to directions toward a top and a bottom in the drawing. In following specifications, unless otherwise specified, a direction may refer to opposite directions respectively toward opposite sides along the direction. Further, in case that it is necessary to distinguish the opposite directions respectively toward opposite sides along the direction from each other, the opposite directions may include a direction toward a side and a direction toward another side. For example, a side and another side may be referred to a side and another side along the direction, respectively. Based on FIG. 1, a side, to which an arrow points, is referred to as a side, and the opposite side thereto is referred to as another side.

Referring to FIGS. 1, 2, and 3, an inkjet printing apparatus 1 according to an embodiment may include a stage STA on which a target substrate SUB is seated or disposed, an inkjet head 100 on which nozzles 300 are disposed, a base frame 600, ink storage 500, a first link pipe IL1 connecting the inkjet head 100 and the ink storage 500 to each other, a second link pipe IL2 connecting the inkjet head 100 and the ink storage 500 to each other, and a temperature controller 200. The inkjet printing apparatus 1 according to an embodiment may spray ink 90 onto the target substrate SUB seated on the stage STA by using the inkjet head 100 and the nozzles 300.

The stage STA may function to seat the target substrate SUB thereon. The stage STA may be disposed on a first rail RL1 extending in the second direction DR2 and a second rail RL2 extending in the second direction DR2. The stage STA may move on and along the first rail RL1 and the second rail RL2 in the second direction DR2 by an operation of a separate moving member. Accordingly, the target substrate SUB may also move along with the stage STA in the second direction DR2. The stage STA and the target substrate SUB may move along the second direction DR2, and may pass by the inkjet head 100 with being disposed thereunder. At this time, the inkjet head 100 may spray or inject the ink 90 on a top surface of the target substrate SUB. Although the drawing shows a structure in which the stage STA moves in the second direction DR2, embodiments are not limited thereto. In some embodiments, the inkjet head 100 may move in the second direction DR2. Hereinafter, for convenience of description, the description will be based on an example in which the stage STA moves in the second direction DR2 and on and along the first rail RL1 and the second rail RL2.

The inkjet head 100 may function to spray the ink 90 onto the target substrate SUB through the nozzles 300. The nozzles 300 may be attached to a bottom surface of the inkjet head 100. The nozzles 300 may be arranged to be spaced apart from each other and may be disposed on the bottom surface of the inkjet head 100, and may be arranged in one row or a plurality of rows. In FIG. 2, it is shown in the nozzles 300 may be arranged in two rows in a zig-zag manner. However, embodiments are not limited thereto. For example, the nozzles 300 may be arranged in a larger number of rows and may be arranged so as to overlap each other in a non-zigzag manner. In some embodiments, a shape of the inkjet head may have a rectangular shape. However, embodiments are not limited thereto.

The inkjet head 100 may be spaced apart from the target substrate SUB seated on the stage STA in the third direction DR3, and may eject the ink 90 on the top surface of the target substrate SUB in the third direction DR3. The inkjet head 100 may be disposed on a base frame 600 and thus a position of the inkjet head may be adjusted by a construction of the base frame 600.

The base frame 600 may function to mount thereon and move the inkjet head 100 having the nozzles 300 disposed thereon, and to define a movement path thereof. The base frame 600 may include a support 610 and a moving unit 630.

The support 610 of the base frame 600 may include a first support 611 and a second support 612. The first support 611 may function to mount thereon the inkjet head 100 having the nozzles 300 disposed on a bottom surface of the inkjet head 100. In some embodiments, the first support 611 may have a bar shape extending in the first direction DR1. However, embodiments are not limited thereto. The second support 612 may function to support the first support 611 in the third direction DR3. The second support 612 may have two portions respectively connected to opposite ends in the first direction DR1 of the first support 611 and extending in the third direction DR3. Accordingly, the first support 611 and the inkjet head 100 having the nozzles 300 disposed thereon may be spaced apart from the stage STA in the third direction DR3.

A portion of the second support 612 connected to an end portion of the first support 611 in the first direction DR1 and another portion of the second support 612 connected to another end portion in the first direction DR1 of the first support 611 may be spaced apart from each other in the first direction DR1. The stage STA and the substrate SUB may be disposed in a space between a portion of the second support 612 connected to an end portion in the first direction DR1 of the first support 611 and another portion of the second support 612 connected to another end portion in the first direction DR1 of the first support 611.

The moving unit 630 of the base frame 600 may function to mount thereon the inkjet head 100 having the nozzles 300 disposed thereon and to move the inkjet head 100 having the nozzles 300 disposed thereon in the first direction DR1. The moving unit 630 may include a movable portion 631 mounted on the first support 611 and movable in the first direction DR1 and a fixing portion 632 which is disposed on a bottom surface of the movable portion 631 and on which the inkjet head 100 having the nozzles 300 disposed thereon is disposed. The movable portion 631 may be disposed on the first support 611 and may move in the first direction DR1 with being disposed on the first support 611. The inkjet head 100 having the nozzles 300 disposed thereon may be fixed to the fixing portion 632 and may move together with the movable portion 631 in the first direction DR1.

The ink storage 500 may function to store the ink 90 to be supplied to the inkjet head 100. In some embodiments, the ink storage 500 may be disposed at a side of the first support 611. However, embodiments are not limited thereto. The ink storage 500 may be connected to the inkjet head 100 via the first link pipe IL1 and the second link pipe IL2. The ink 90 of the ink storage 500 may be supplied to the inkjet head 100 via the first link pipe ILL and the ink 90 remaining in the inkjet head 100 after the ink has been ejected from the inkjet head 100 may be collected back to the ink storage 500 via the second link pipe IL2. A detailed description thereof will be provided below.

The temperature controller 200 may perform a role in controlling a temperature of the ink 90 to be supplied to the inkjet head 100 or the temperature of the ink 90 to be collected into the ink storage 500. The temperature controller 200 may be spaced apart from the inkjet head 100, and may be spaced apart from the ink storage 500. In some embodiments, the temperature controller 200 may be disposed between the inkjet head 100 and the ink storage 500. However, embodiments are not limited thereto.

The temperature controller 200 may surround the first link pipe IL1 and the second link pipe IL2. For example, the first link pipe IL1 and the second link pipe IL2 may extend through the temperature controller 200. Accordingly, the temperature of the ink 90 to be supplied to the inkjet head 100 from the ink storage 500 via the first link pipe IL1 may be controlled by the temperature controller 200. Further, the temperature of the ink 90 to be collected from the inkjet head 100 to the ink storage 500 via the second link pipe IL2 may be controlled by the temperature controller 200. A detailed description thereof will be described below in conjunction with FIGS. 4, 5, 6, and 8.

The ink 90 may include solvent 91 and solid particles dispersed in the solvent 91. The solid particles may refer to bipolar elements 95. The ink 90 may be provided in a solution or colloidal state. The bipolar elements 95 may include a first end portion having a first polarity and a second end portion opposite thereto having a second polarity opposite to the first polarity. The bipolar elements 95 may be contained in a dispersed state in the solvent 91 and may be supplied to the inkjet head 100 in the dispersed state and may be ejected or injected toward the target sub state.

In some embodiments, the solvent 91 may be acetone, water, alcohol, toluene, propylene glycol (PG) or propylene glycol methyl acetate (PGMA). However, embodiments are not limited thereto.

The inkjet printing apparatus 1 may further include a probe device 700.

The probe device 700 may function to generate an electric field on the target substrate SUB. The probe device 700 may be disposed on the stage STA. The probe device 700 may include a sub-stage 710 that supports the target substrate SUB thereon. For example, the target substrate SUB may be seated or disposed on the sub-stage 710 of the probe device 700 disposed on the stage STA.

After the bipolar elements 95 of the ink 90 having a specific orientation are sprayed onto the target substrate SUB, the bipolar elements 95 may be disposed on the target substrate SUB with being oriented in a direction under the electric field generated by the probe device 700. A detailed description thereof will be described below in conjunction with FIGS. 9, 10, 11, and 12.

Hereinafter, an ink 90 circulation system between the ink storage 500 and the inkjet head 100 of the inkjet printing apparatus 1 according to an embodiment and a temperature control method of the ink 90 using the temperature controller 200 will be described.

Figure 4:
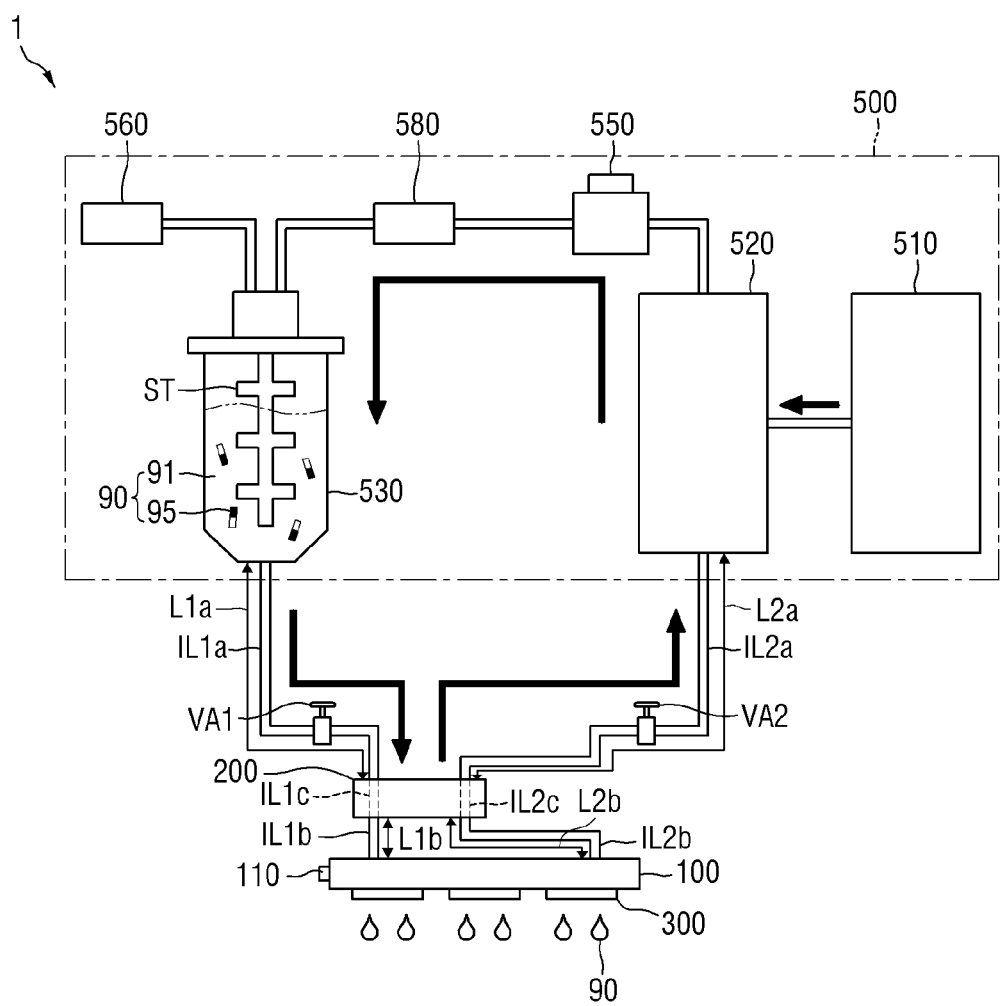
FIG. 4 is a structural diagram showing a connection relationship between ink storage and the inkjet head of the inkjet printing apparatus according to the embodiment of FIG. 1.
Figure 5:
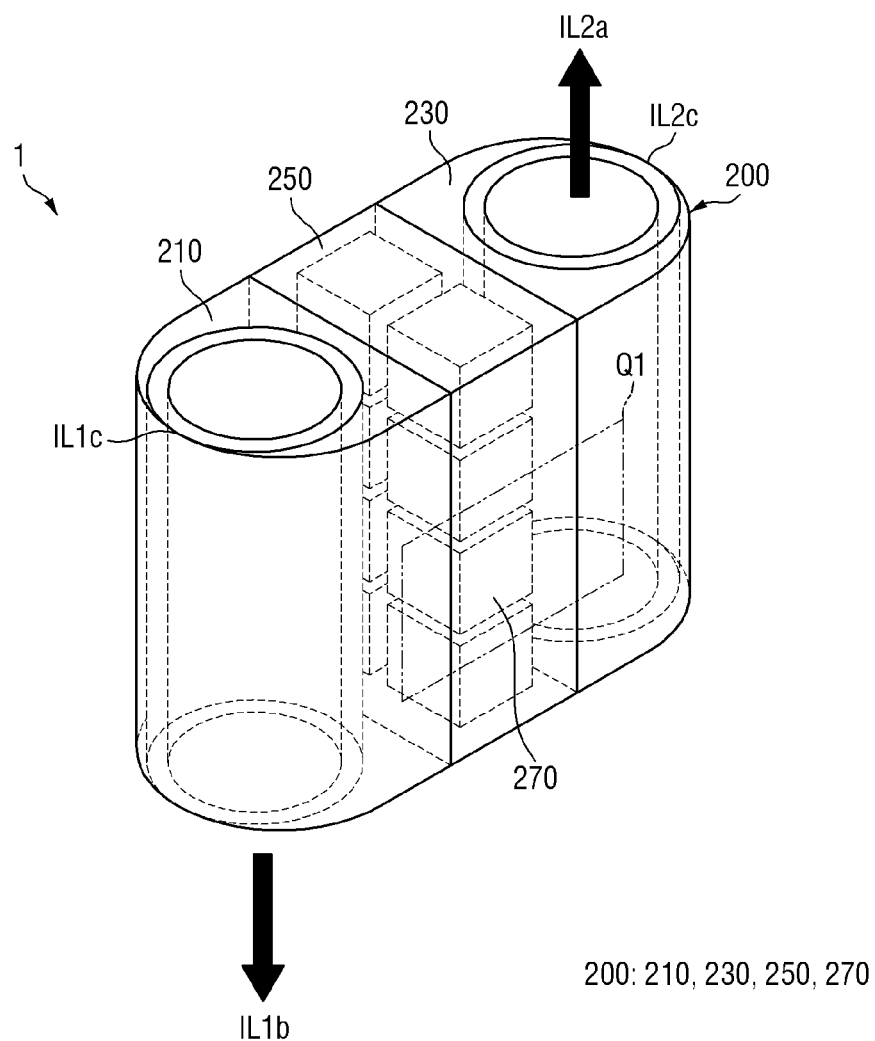
FIG. 5 is a schematic perspective view showing a temperature controller of the inkjet printing apparatus according to the embodiment of FIG. 1.
Figure 6:
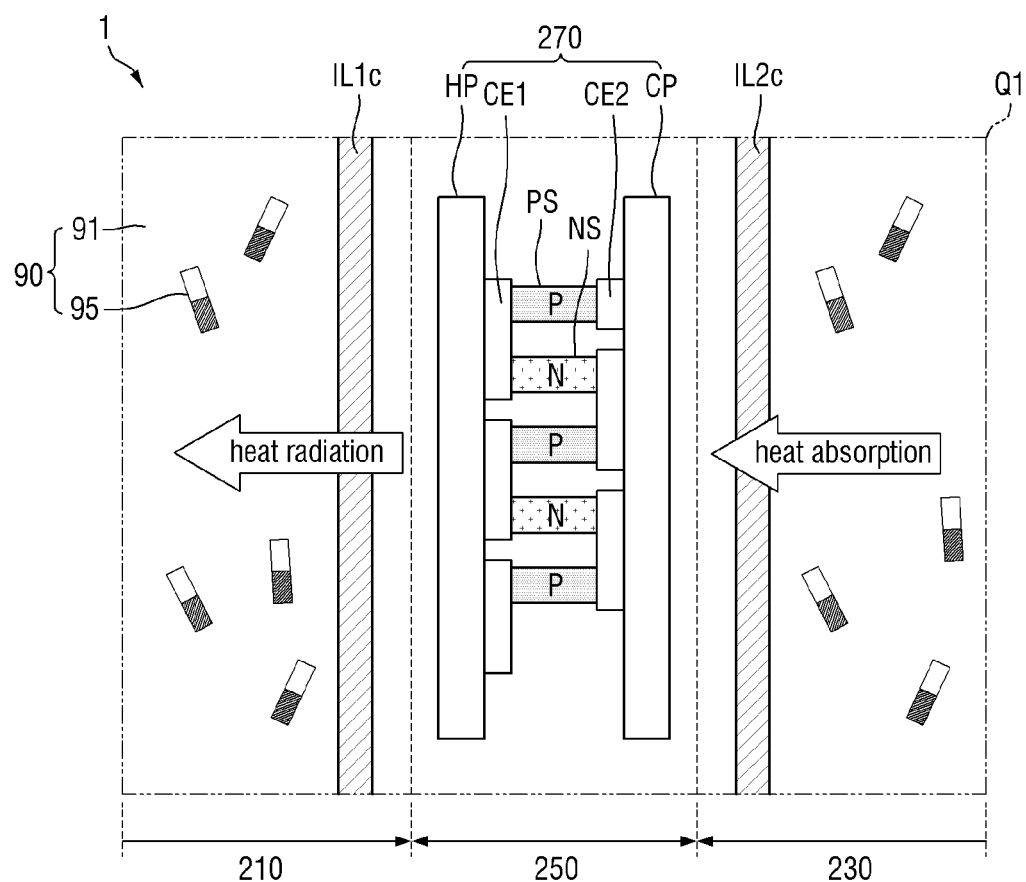
FIG. 6 is a schematic enlarged view of a Q1 area of FIG. 5.
Figure 7:
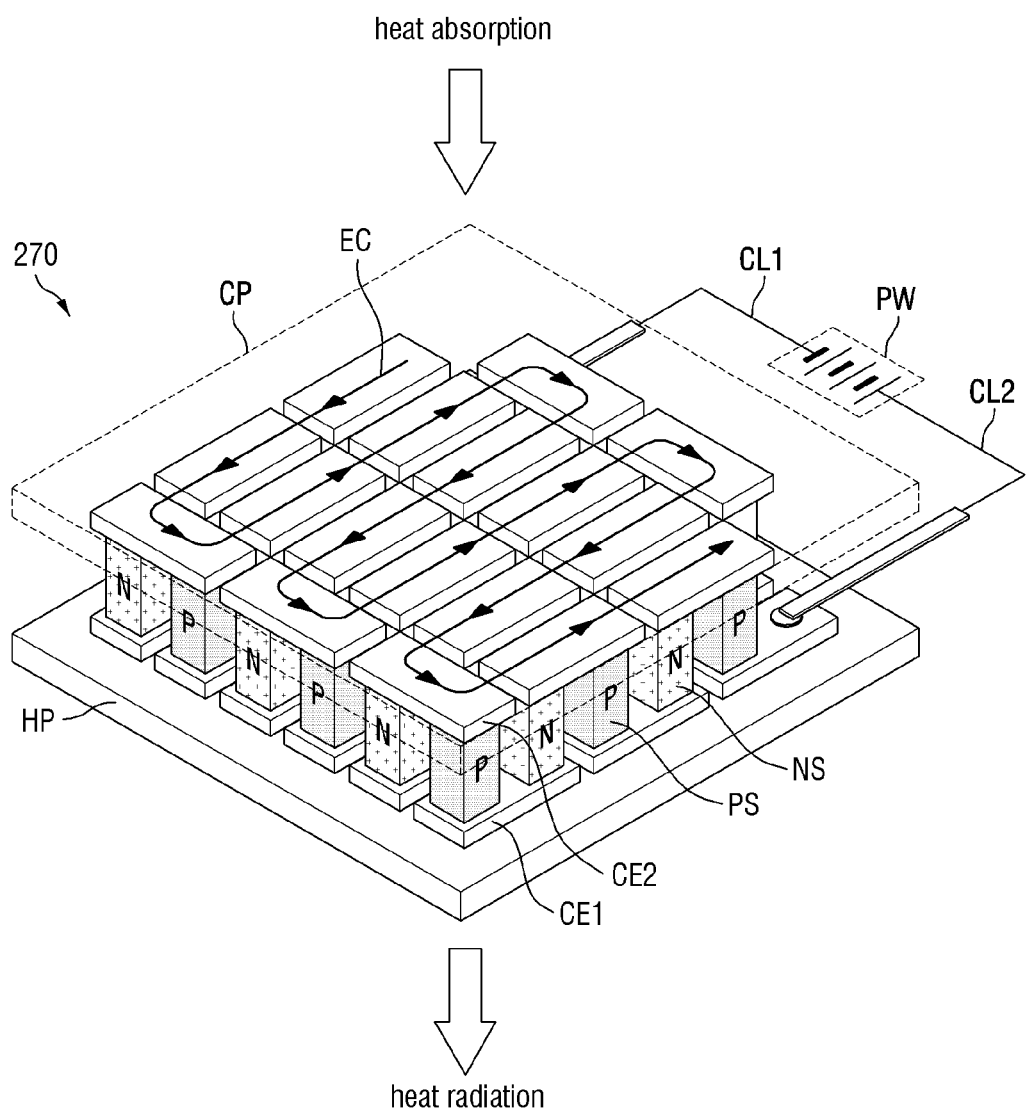
FIG. 7 is a structure diagram showing a configuration of a Peltier element as a temperature adjustment member.
Figure 8:
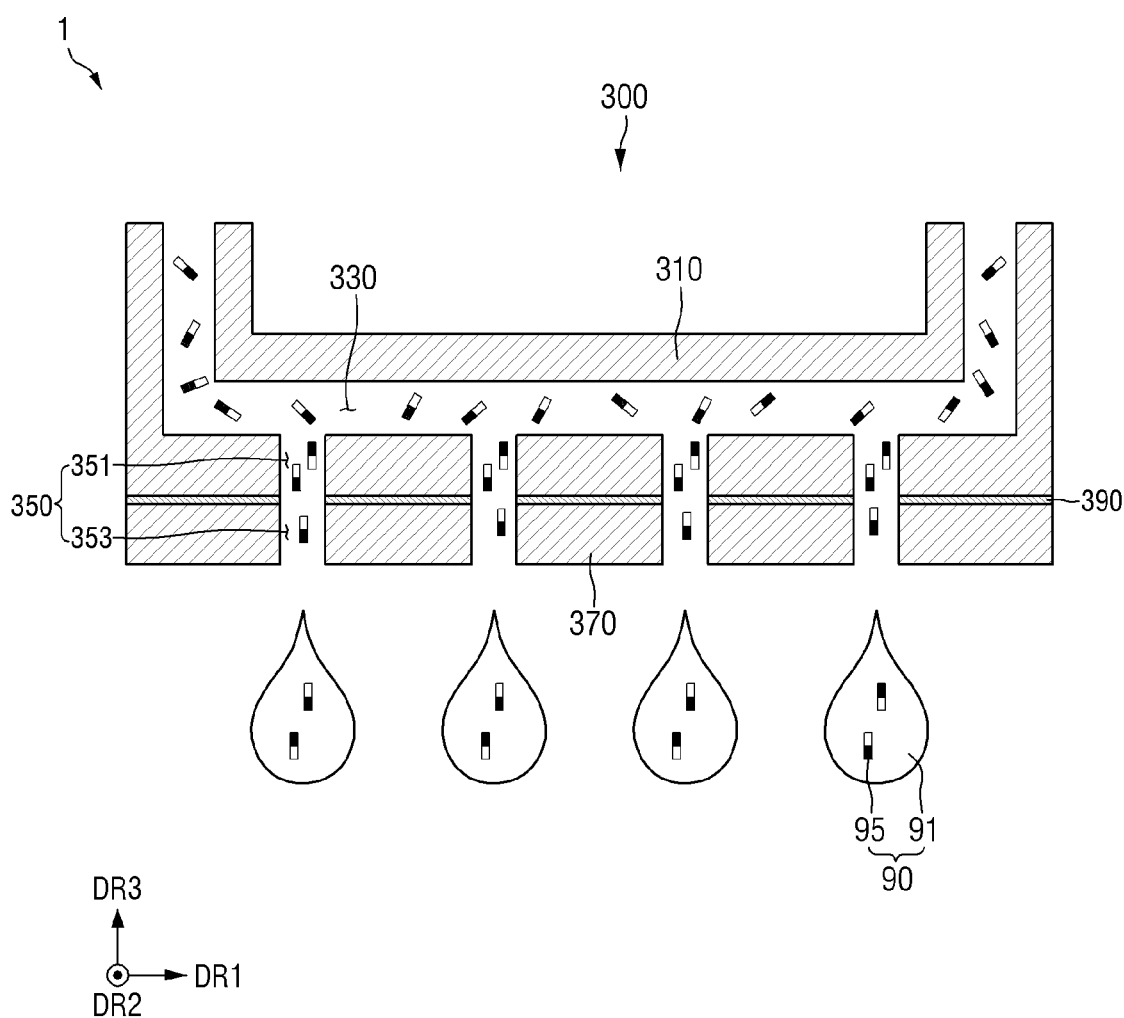
FIG. 8 is a structure diagram showing an inside of the inkjet head according to the embodiment of FIG. 1.

FIG. 4 is a schematic structural diagram showing a connection relationship between the ink storage and the inkjet head of the inkjet printing apparatus according to the embodiment of FIG. 1. FIG. 5 is a schematic perspective view showing the temperature controller of the inkjet printing apparatus according to the embodiment of FIG. 1. FIG. 6 is a schematic enlarged view of a Q1 area of FIG. 5. FIG. 7 is a schematic structure diagram showing a configuration of a Peltier element as a temperature adjustment member. FIG. 8 is a schematic structure diagram showing an inside of the inkjet head according to the embodiment of FIG. 1.

Referring to FIG. 4, the ink storage 500 may supply the ink 90 to the inkjet head 100, and the inkjet head 100 may eject the supplied ink 90. A portion of the ink 90 supplied to the inkjet head 100 may be ejected from the inkjet head 100 and the remainder thereof may be supplied to the ink storage 500 again. For example, the ink 90 may circulate between the ink storage 500 and the inkjet head 100 through the first link pipe IL1 and the second link pipe IL2.

In some embodiments, the ink storage 500 may include a first ink storage 510, a second ink storage 520, a third ink storage 530, a pressure pump 550, a compressor 560, and a flow meter. For example, the second ink storage 520, the pressure pump 550, and the third ink storage 530 of the ink storage 500 may be connected to the inkjet head 100, thereby constituting a circulation system.

The first ink storage 510 may function to prepare formulated ink 90. The ink 90 including the solvent 91 and the bipolar elements 95 dispersed therein may be prepared in the first ink storage 510, and the ink 90 from the first ink storage 510 may be supplied to the circulation system.

The second ink storage 520 may be connected to the first ink storage 510 such that the prepared ink 90 may be supplied from the first ink storage 510 to the second ink storage 520. Further, the second ink storage 520 may function as storage into which a portion of the ink 90 remaining after being ejected from the inkjet head 100 is collected via the second link pipe IL2. The second ink storage 520 may be located between the third ink storage 530 and the inkjet head 100 and the first ink storage 510. In case that the second ink storage 520 is located between the third ink storage 530 and the first ink storage 510 or between the inkjet head 100 and the first ink storage 510, an appropriate amount of the ink 90 may be supplied to the third ink storage 530 such that the bipolar elements 95 may be smoothly dispersed in the solvent. The ink 90 supplied to the second ink storage 520 may be supplied to the third ink storage 530 via the pressure pump 550.

The pressure pump 550 may generate power to flow or move fluid so that the ink 90 may be circulated in the circulation system. The flow meter 580 may be provided between the pressure pump 550 and the third ink storage 530. The flow meter 580 may measure a flow rate of the ink 90 to be supplied to the third ink storage 530. The pressure pump 550 may control a flow rate of the ink 90 to be supplied to the third ink storage 530 based on the flow rate of the ink 90 measured by the flow meter 580.

A compressor 560 may function to regulate a pressure in the third ink storage 530. The compressor 560 may remove gas so that an inside of the third ink storage 530 is maintained in a vacuum state, or may introduce external inert gas into the third ink storage 530 such that the third ink storage 530 may have a defined pressure. However, in another example, the compressor 560 may be omitted.

The third ink storage 530 may supply the ink 90 to the inkjet head 100 via the first link pipe ml. In some embodiments, the third ink storage 530 may include an agitator ST. The agitator ST may disperse the bipolar elements 95 in the ink 90. As the agitator ST rotates, the bipolar elements 95 of the ink 90 supplied to the third ink storage 530 may maintain a dispersed state thereof in case that the bipolar elements 95 does not settle down. For example, the agitator ST of the third ink storage 530 may prevent the bipolar elements 95 from settling down on a bottom portion of the third ink storage 530 and thus prevent the number of the bipolar elements 95 in the ink 90 ejected via the inkjet head 100 from decreasing. Accordingly, the third ink storage 530 may supply the ink 90 in which the bipolar elements 95 are smoothly dispersed to the inkjet head 100. The inkjet head 100 may eject the ink 90 containing the bipolar elements 95 therein at a density above or equal to a reference level.

In an example, the solvent 91 may generally have a correlation between a temperature and a viscosity in which as a temperature of the solvent 91 of the ink 90 increases, a viscosity thereof decreases. Accordingly, in case that the temperature of the ink storage 500 increases, the viscosity of the solvent 91 of the ink 90 is lowered, such that sedimentation of the bipolar elements 95 of the ink 90 may increase. For example, as the temperature of the ink storage 500 increases, the temperature of the ink 90 in the ink storage 500 increases. Thus, the viscosity of the solvent 91 of the ink 90 may decrease. Due to the decreased viscosity of the solvent 91, the sedimentation of the bipolar elements 95 increases, and the number of bipolar elements 95 of the ink 90 to be supplied from the third ink storage 530 to the inkjet head 100 is reduced. Therefore, inkjet head 100 may not be able to eject the ink 90 containing therein the bipolar elements 95 at a density above or equal to a reference level. Accordingly, the temperature of the ink storage 500 may be required to be kept at a relatively low level.

In an example, each of the nozzles 300 disposed on the inkjet head 100 may be required to eject a sufficient amount of a droplet of the ink 90. To this end, the solvent 91 of the ink 90 may have to satisfy a reference level of the viscosity. For example, in case that the viscosity of the solvent 91 of the ink 90 in the inkjet head 100 is relatively low, the ink 90 may be ejected in a relatively larger amount. In case that the viscosity of the solvent 91 of the ink 90 is relatively high, the ink 90 may be ejected in a relatively smaller amount. For this reason, the inkjet head 100 may further include a head heater 110. The head heater 110 may heat the inkjet head 100 so as to maintain a relatively high temperature of the inkjet head 100, and thus the ink 90 supplied from the ink storage 500 to the inkjet head 100 may satisfy the reference level of the viscosity.

As described above, the target viscosity of the solvent 91 of the ink 90 in the ink storage 500 and the target viscosity of the solvent 91 of the ink 90 in inkjet head 100 are different from each other. Thus, the temperature of the ink storage 500 and the temperature of the inkjet head 100 may be different from each other. For example, the temperature of the ink storage 500 may be lower than the temperature of the inkjet head 100. For example, the temperature of the ink 90 in the ink storage 500 may be lower than the temperature of the ink 90 in the inkjet head 100. For example, the viscosity of the solvent 91 of the ink 90 in ink storage 500 may be relatively higher than the viscosity of the solvent 91 of the ink 90 in inkjet head 100.

Further, because the nozzles 300 disposed on the inkjet head 100 eject the ink 90 in a constant amount, the temperature of the inkjet head 100 may be required to be constant over an entire portion of the inkjet head 100. For example, in case that the temperature of the inkjet head 100 varies based on the locations of the portions of the inkjet head 100, the viscosity of the ink 90 in the inkjet head 100 varies based on the locations of the portions of the inkjet head 100, and accordingly, the amount of a droplet of the ink 90 ejected from each of the nozzles may vary based on a position of the corresponding nozzle. For this reason, the temperature of the inkjet head 100 may be required to be constant over the entire portion of the inkjet head 100. However, as described above, the temperature of the ink 90 in the ink storage 500 may be lower than the temperature of the ink 90 in the inkjet head 100, such that the temperature of the ink 90 to be supplied to the inkjet head 100 via the first link pipe IL1 may be lower than the temperature of the ink 90 in the inkjet head 100, and, thus, a temperature of a portion of the inkjet head 100 adjacent to the first link pipe IL1 may be relatively lower than a temperature of a remaining portion of the inkjet head 100. Therefore, the ink 90 to be supplied to the inkjet head 100 via the first link pipe IL1 may be required to be preheated before being supplied to the inkjet head 100 and the preheated ink may be supplied to the inkjet head 100.

As described above, the inkjet printing apparatus 1 according to an embodiment may include a temperature controller 200. For example, the first link pipe IL1 may include a first heat-exchange portion IL1c disposed in the temperature controller 200, a first supplying connection portion IL1a connecting the first heat-exchange portion IL1c and the ink storage 500 to each other, and a second supplying connection portion IL1b connecting the first heat-exchange portion IL1c and the inkjet head 100 to each other. The second link pipe IL2 may include a second heat-exchange portion IL2c disposed in the temperature controller 200, a first collecting connection portion IL2b connecting the second heat-exchange portion IL2c and the inkjet head 100 to each other, and a second collecting connection portion IL2a connecting the second heat-exchange portion IL2c and the ink storage 500 to each other. For example, the first supplying connection portion IL1a may connect the third ink storage 530 and the first heat-exchange portion IL1c to each other, and the second collecting connection portion IL2a may connect the second ink storage 520 and the second heat-exchange portion IL2c to each other.

The temperature controller 200 may heat the first link pipe IL1 extending (or passing) through the temperature controller 200 and may cool the second link pipe IL2 extending (or passing) through the temperature controller 200. Thus, the temperature of the ink storage 500 may be maintained at a relatively low level than the temperature of the inkjet head 100 and thus the temperature of the inkjet head 100 may be kept constant over the entire portion of the inkjet head 100. Hereinafter, an arrangement and a configuration of the temperature controller 200 will be described.

Referring to FIGS. 5, 6, and 7 in addition to FIG. 4, the temperature controller 200 may be disposed closer to the inkjet head 100 than to the ink storage 500.

As described above, the temperature controller 200 may be disposed to be spaced apart from the inkjet head 100 and spaced apart from the ink storage 500. In case that the temperature controller 200 contacts at least one of the inkjet head 100 and the ink storage 500, heat exchange of the first heat-exchange portion IL1c or the second heat-exchange portion IL2c in the temperature controller 200 may not be effectively performed, and thus, the target temperature of each of the ink storage 500 and the inkjet head 100 may not be maintained reliably or constantly.

In some embodiments, the temperature controller 200 may be disposed adjacent to the inkjet head 100. This may be intended to shorten a path for transferring the heated ink 90 from the first heat-exchange portion IL1c of the first link pipe IL1 in the temperature controller 200 to the inkjet head 100. Accordingly, a length L1a of the first supplying connection portion IL1a of the first link pipe IL1 may be greater than a length L1b of the second supplying connection portion IL1b thereof, and a length L2b of the first collecting connection portion IL2b of the second link pipe IL2 may be shorter than a length L2a of the second collecting connection portion IL2a thereof.

Further, in some embodiments, a horizontal center of the temperature controller 200 may be closer to a portion of the inkjet head 100 connected to the first link pipe IL1 than to a portion of the inkjet head 100 connected to the second link pipe IL2, as shown in FIG. 4. This may be intended to minimize the length L1b of the second supplying connection portion IL1b of the first link pipe IL1 to shorten the path of transferring the heated ink 90 from the first heat-exchange portion IL1c of the first link pipe IL1 to the inkjet head 100. Accordingly, the length L1b of the second supplying connection portion IL1b of the first link pipe IL1 may be shorter than the length L2b of the first collecting connection portion IL2b of the second link pipe IL2.

A first valve VA1 may be disposed on the first link pipe IL1. A second valve VA2 may be disposed on the second link pipe IL2. The first valve VA1 may control a flow rate of the ink 90 to be supplied from the ink storage 500 to the inkjet head 100, and the second valve VA2 may control a flow rate of the ink 90 to be collected from the inkjet head 100 to the ink storage 500. In some embodiments, the first valve VA1 may be disposed at the first supplying connection portion IL1a of the first link pipe ILL The second valve VA2 may be disposed at the second collecting connection portion IL2a of the second link pipe IL2. However, embodiments are not limited thereto. For example, the first valve VA1 may be disposed at the second supplying connection portion IL1b of the first link pipe ILL in case that the second valve VA2 is disposed at the first collecting connection portion IL2b of the second link pipe IL2.

The temperature controller 200 may include a heater 210, a cooler 230, a heat source 250 and a temperature adjustment member 270 disposed inside the heat source 250.

The heater 210 of the temperature controller 200 may function to heat the first heat-exchange portion IL1c of the first link pipe ILL The first heat-exchange portion IL1c may be disposed in the heater 210. In some embodiments, the heater 210 may refer to a portion of the temperature controller 200 which the first link pipe IL1 extends (or passes) through, and may surround the first heat-exchange portion IL1c of the first link pipe ILL However, embodiments are not limited thereto. For example, the first heat-exchange portion IL1c may be disposed adjacent to the heater 210. Hereinafter, for convenience of description, the description is based on an example in which the first link pipe IL1 extends through the heater 210 of the temperature controller 200. For example, the first heat-exchange portion IL1c may be fixed to the temperature controller 200 and may be heated stably. In this regard, the heater 210 may be referred to as a first temperature adjuster.

The cooler 230 of the temperature controller 200 may function to cool the second heat-exchange portion IL2c of the second link pipe IL2. The cooler 230 may be opposite to the heater 210. The second heat-exchange portion IL2c may be disposed in the cooler 230. In some embodiments, the cooler 230 may refer to a portion of the temperature controller 200 which the second link pipe IL2 extends through, and may surround the second heat-exchange portion IL2c of the second link pipe IL2. However, embodiments are not limited thereto. For example, the second heat-exchange portion IL2c may be disposed adjacent to the cooler 230. Hereinafter, for convenience of description, the description is based on an example in which the second link pipe IL2 extends through the cooler 230 of the temperature controller 200. For example, the second heat-exchange portion IL2c may be fixed to the temperature controller 200 and may be cooled stably. In this regard, the cooler 230 may be referred to as a second temperature adjuster.

The heat source 250 of the temperature controller 200 may refer to a space in which the temperature adjustment member 270 is disposed. The heat source 250 may be disposed between the cooler 230 and the heater 210.

The temperature adjustment member 270 of the temperature controller 200 may absorb heat energy of the cooler 230 and discharge heat energy to the heater 210. The temperature adjustment member 270 according to an embodiment may be implemented as a thermoelectric element. For example, the temperature adjustment member 270 as a Peltier element may include temperature adjustment members disposed in the heat source 250. However, embodiments are not limited thereto. Hereinafter, for the convenience of description, the description is based on an example in which the temperature adjustment member 270 is implemented as the Peltier element.

In case that the temperature adjustment member 270 is implemented as the Peltier element, the temperature adjustment member 270 may include a cooling plate CP, a heating plate HP, first connection electrodes CE1, second connection electrodes CE2, P-type thermoelectric semiconductor element PS, and N-type thermoelectric semiconductor element NS.

The cooling plate CP of the temperature adjustment member 270 may absorb heat energy of a surrounding. A first surface of the cooling plate CP may refer to a surface facing the cooler 230 of the temperature controller 200, and a second surface thereof may refer to a surface on which the second connection electrodes CE2 are disposed.

The heating plate HP of the temperature adjustment member 270 may discharge (or radiate) heat energy to the around areas of the heating plate HP. A first surface of the heating plate HP may refer to a surface facing the heater 210 of the temperature controller 200, in case that a second surface refers to a surface on which the first connection electrodes CE1 are disposed. The second surface of the cooling plate CP of the temperature adjustment member 270 may face the second surface of the heating plate HP. Accordingly, the first connection electrodes CE1 and the second connection electrodes CE2 may face each other.

The P-type thermoelectric semiconductor element PS of the temperature adjustment member 270 may be a semiconductor element doped with P-type impurity, in case that the N-type thermoelectric semiconductor element NS thereof is a semiconductor element doped with N-type impurity. The P-type thermoelectric semiconductor element PS and the N-type thermoelectric semiconductor element NS may be disposed between the cooling plate CP and the heating plate HP, and be spaced apart from each other and may be alternately arranged with each other. The P-type thermoelectric semiconductor element PS and the N-type thermoelectric semiconductor element NS may be connected (e.g., electrically connected) to each other via the first connection electrode CE1 or the second connection electrode CE2. For example, the P-type thermoelectric semiconductor element PS and the N-type thermoelectric semiconductor element NS adjacent thereto may be commonly connected to at least one of the first connection electrode CE1 and the second connection electrode CE2, in case that each of the P-type thermoelectric semiconductor element PS and the N-type thermoelectric semiconductor element NS adjacent thereto is individually connected to the other of the first connection electrode CE1 and the second connection electrode CE2.

For example, in case that the uppermost P-type thermoelectric semiconductor element PS in FIG. 6 is referred to as 'a first thermoelectric semiconductor element', and the N-type thermoelectric semiconductor element NS adjacent to the first thermoelectric semiconductor element is referred to as 'a second thermoelectric semiconductor element', a heating plate HP-facing end portion of the first thermoelectric semiconductor element and a heating plate HP-facing end portion of the second thermoelectric element may be commonly connected to a single first connection electrode CE1, in case that a cooling plate CP-facing end portion of the first thermoelectric semiconductor element may be connected (e.g., electrically connected) to a second connection electrode CE2, and a cooling plate CP-facing end portion of the second thermoelectric element may be connected (e.g., electrically connected) to another second connection electrode CE2 adjacent the second connection electrode CE2 to which the cooling plate CP-facing end portion of the first thermoelectric semiconductor element is connected (e.g., electrically connected).

In some embodiments, the N-type thermoelectric semiconductor element NS, the P-type thermoelectric semiconductor element PS adjacent thereto, and the first connection electrode CE1 or the second connection electrode CE2 commonly connected thereto may constitute a pi ($\pi$) shape. However, embodiments are not limited thereto.

The P-type thermoelectric semiconductor elements PS and the N-type thermoelectric semiconductor elements NS may be connected in series to and disposed between a first terminal CL1 of a direct current (DC) power source PW and a second terminal CL2 of the DC power source PW as shown in FIG. 7. For example, the P-type thermoelectric semiconductor element PS and the N-type thermoelectric semiconductor element NS may be connected in series, via the first connection electrodes CE1 and the second connection electrodes CE2, to and disposed the first terminal CL1 and the second terminals CL2 of the DC power source PW. The first terminal CL1 may function as a negative terminal of the DC power source PW, in case that the second terminal CL2 functions as a positive terminal of the DC power source PW. The negative terminal may output a negative voltage, and the positive terminal may output a positive voltage.

Among the first connection electrodes CE1, a first connection electrode CE1 connected to the second terminal CL2 of the DC power source PW is referred to as 'a first lower electrode'. Among the first connection electrodes CE1, a first connection electrode CE1 which is different from the first connection electrode CE1 connected to the first terminal CL1 and is connected to the second terminal CL2 of the DC power source PW is referred to as 'a second lower electrode'. For example, the first lower electrode may be connected to one of the P-type thermoelectric semiconductor element PS and the N-type thermoelectric semiconductor element NS, and the second lower electrode may be connected to the other of the P-type thermoelectric semiconductor element PS and the N-type thermoelectric semiconductor element NS. For example, the first lower electrode may be a first connection electrode CE1 connected to the P-type thermoelectric semiconductor element PS, in case that the second lower electrode is a first connection electrode CE1 connected to the N-type thermoelectric semiconductor element NS. For example, the first lower electrode may be connected to the positive terminal of the DC power source PW and the second lower electrode may be connected to the negative terminal of the DC power source PW. Thus, current flow EC as shown in FIG. 7 may be generated along the second connection electrodes CE2. For example, in case that a DC voltage is applied across two different elements, heat absorption may occur at the cooling plate CP and heat generation may occur at the heating plate HP due to a Peltier effect in which a side absorbs heat and another side generates heat according to a direction of the current.

The cooling plate CP may be disposed adjacent to the cooler 230 of the temperature controller 200 and the heating plate HP may be disposed adjacent to the heater 210 of the temperature controller 200. Thus, the heat energy of the ink 90 flowing through the second heat-exchange portion IL2c of the second link pipe IL2 disposed in the cooler 230 may be absorbed and thus cooling of the ink may occur. Further, the ink 90 flowing through the first heat-exchange portion IL1c of the first link pipe IL1 disposed in the heater 210 may receive heat energy and thus may be heated.

In the inkjet printing apparatus 1 according to an embodiment having the above configuration, the ink 90 flowing out of the ink storage 500 and through the first link pipe IL1 may be heated by the heater 210 of the temperature controller 200, and the heated ink may be supplied to the inkjet head 100. Further, the ink 90 flowing out of the inkjet head 100 and through the second link pipe IL2 may be cooled by the cooler 230 of the temperature controller 200, and the cooled ink may be collected again into the ink storage 500. Thus, the temperature of the ink storage 500 may be maintained at a relatively lower level than the temperature of the inkjet head 100, and the temperature of the inkjet head 100 may be kept constant regardless of the locations of the portions of the inkjet head 100, e.g., over an entire portion of the inkjet head 100. Accordingly, the temperature of the ink 90 flowing through the second supplying connection portion IL1b, the temperature of the ink 90 flowing through the inner channel of the inkjet head 100, and the temperature of the ink 90 flowing through the first collecting connection portion IL2b may be substantially equal to each other.

Hereinafter, a process in which the ink 90 passes through an inner channel of the inkjet head 100 and is ejected through the nozzles 300 will be described.

Referring to FIG. 8, the nozzle 300 disposed on a bottom surface of the inkjet head may include a nozzle base 310, an inner channel 330, and ejection holes 350.

The nozzle base 310 of the nozzle 300 may function as a body of the nozzle 300. The nozzle base 310 may be attached to the inkjet head 100.

An ejection portion 370 of the nozzle 300 may be a portion of the nozzle base 310 of the nozzle 300 in which the ejection holes 350 are formed. In the drawing, it is shown that the ejection portion 370 includes a portion connected to the nozzle base 310 and portions spaced therefrom such that the ejection hole 350 is formed therebetween. However, the ejection portion 370 may be integral with each other to be a single body. The ejection hole 350 may be formed in a shape of a hole extending (passing) through the ejection portion 370.

The inner channel 330 of the nozzle 300 may be defined in the nozzle base 310 and may be connected to an inner channel of the inkjet head 100. The inner channel 330 may receive the ink 90 supplied through the first link pipe IL1 connected to the ink storage 500. The remaining ink 90 in the ejection hole 350 after the ejection through the ejection hole 350 may be suppled through the inner channel 330 to the second link pipe IL2 connected to the ink storage 500. The temperature of the ink 90 flowing through the inner channel 330 may be substantially equal to the temperature of the ink 90 flowing through the inner channel of the inkjet head 100. For example, the temperature of the ink 90 flowing through the second supplying connection portion IL1$b$, the temperature of the ink 90 flowing through the inner channel of the inkjet head 100, the temperature of the ink 90 flowing through the inner channel 330 of the nozzle 300, and the temperature of the ink 90 flowing through the first collecting connection portion IL2$b$ may be substantially equal to each other. Thus, the viscosity of the solvent 91 of the ink 90 flowing through the second supplying connection portion IL1$b$, the viscosity of the solvent 91 of the ink 90 flowing through the inner channel of the inkjet head 100, the viscosity of the solvent 91 of the ink 90 flowing through inner channel 330 of nozzle 300, and the viscosity of the solvent 91 of the ink 90 flowing through the first collecting connection portion IL2$b$ may be substantially equal to each other.

The ejection holes 350 may be positioned on the bottom surface of the nozzle base 310 and may be defined in the ejection portion 370. The ejection holes 350 may be spaced apart from each other and may be arranged along an extension direction of the nozzle base 310 (e.g., in the first direction DR1), and may extend through the ejection portion 370 of the nozzle base 310 and may be connected to the inner channel 330 and may eject the ink 90 therethrough. In some embodiments, an amount of the ink 90 that is ejected once through the ejection hole 350 may be in a range of 1 to 50 pl (pico-liter). However, embodiments are not limited thereto.

Each of the ejection holes 350 may include an inlet 351 and an outlet 353. The inlet 351 may be a portion connected (e.g., directly connected) to the inner channel 330. The ink 90 flowing along the inner channel 330 may be supplied to the inlet 351 of the nozzle 300. The outlet 353 may be a portion connected to the inlet 351. The ink 90 supplied from the inlet 351 may be ejected through the outlet 353.

The nozzle 300 may further include an actuator 390. The actuator 390 may perform a role of applying a hydraulic pressure to the ink 90 flowing into the ejection hole 350 so that the ink 90 may be smoothly ejected through the ejection hole 350. The actuator 390 may be disposed in the ejection portion 370 of the nozzle base 310, and may surround each of the ejection holes 350. However, in another example, the actuator 390 may be omitted.

As described above, the temperature of the ink 90 flowing through the inner channel of the inkjet head 100 may be substantially constant regardless of the locations of the portions of the inkjet head 100, e.g., over an entire portion of the inkjet head 100. Thus, the ink 90 injected into the nozzle 300 through the inner channel of the inkjet head 100 may also have a substantially constant temperature regardless of the locations of the portions of the inkjet head 100. Thus, as shown in FIG. 8, the ink may be ejected, through the ejection holes 350, in substantially the same amount of the droplet.

Hereinafter, the probe device 700 of the inkjet printing apparatus 1 according to an embodiment will be described.

Figure 9:
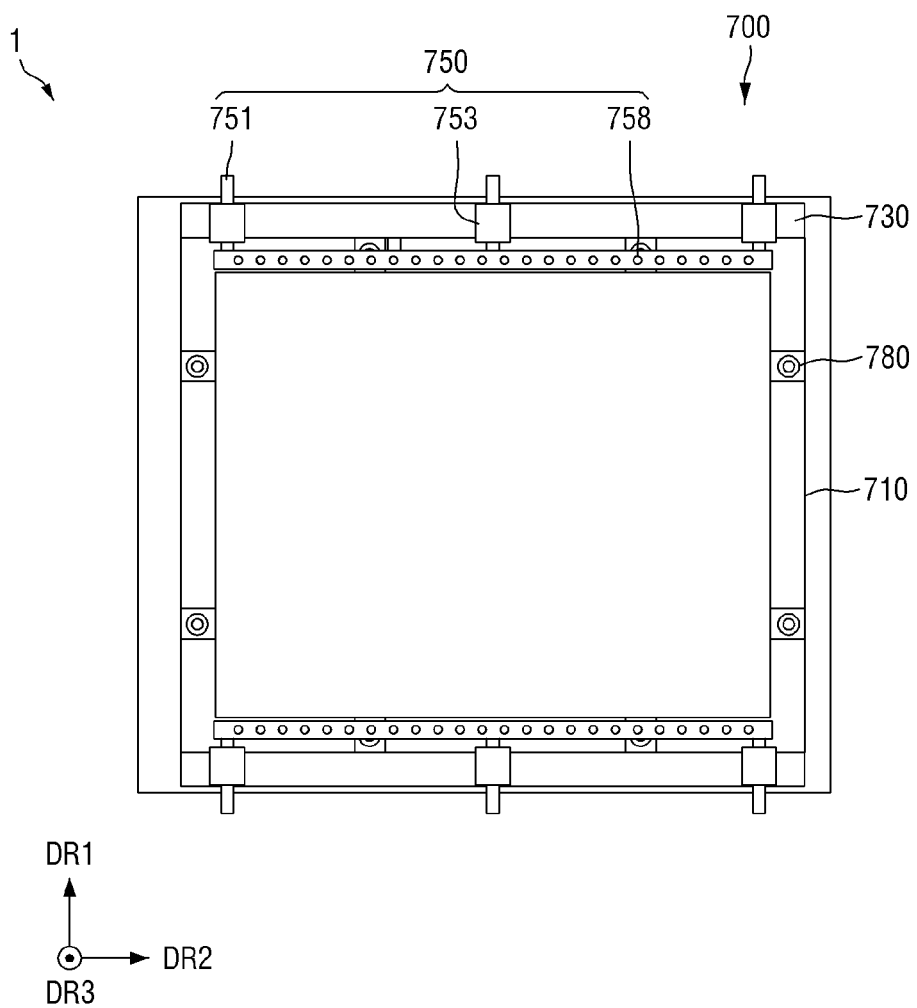
FIG. 9 is a schematic plan view of a probe device of the inkjet printing apparatus according to the embodiment of FIG. 1 as viewed in the third direction.
Figure 10:
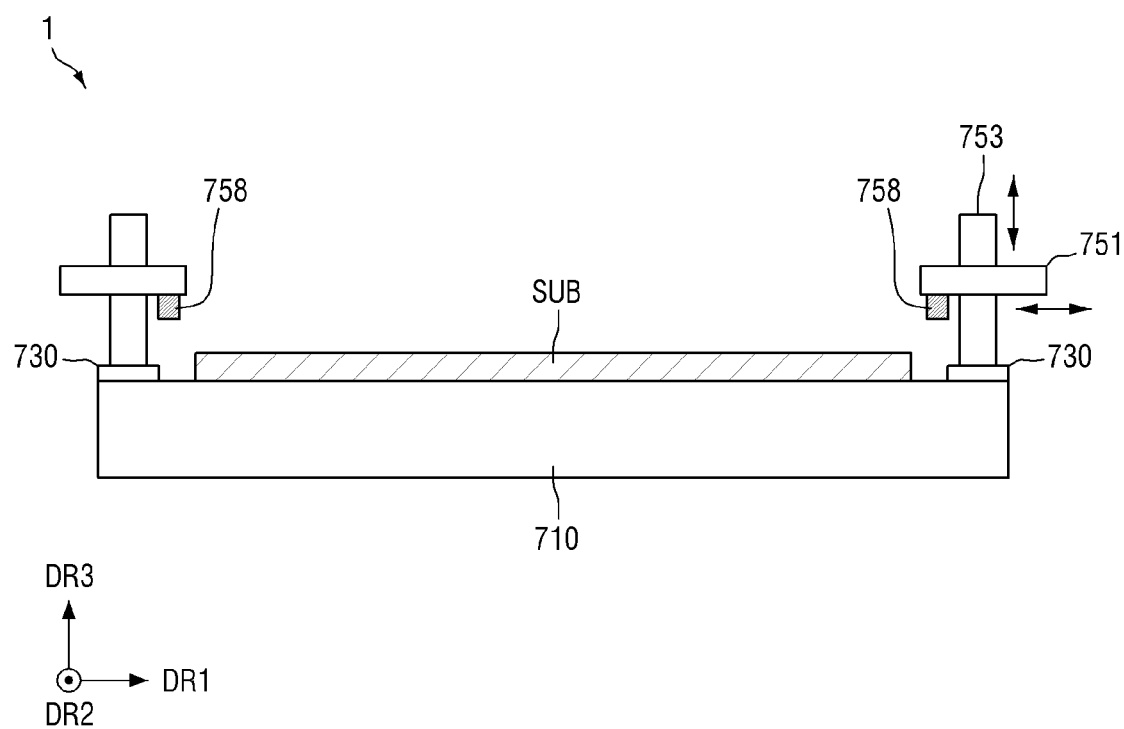
FIGS. 10 and 11 are schematic diagrams showing an operation of the probe device of FIG. 9.
Figure 11:
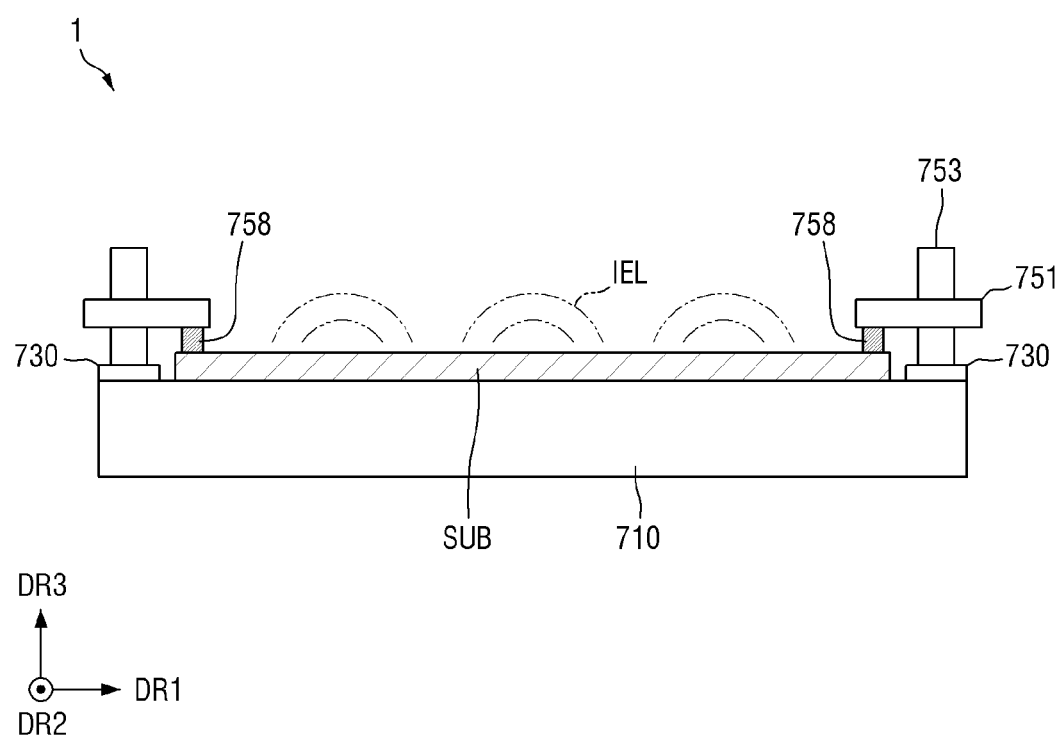
Figure 12:
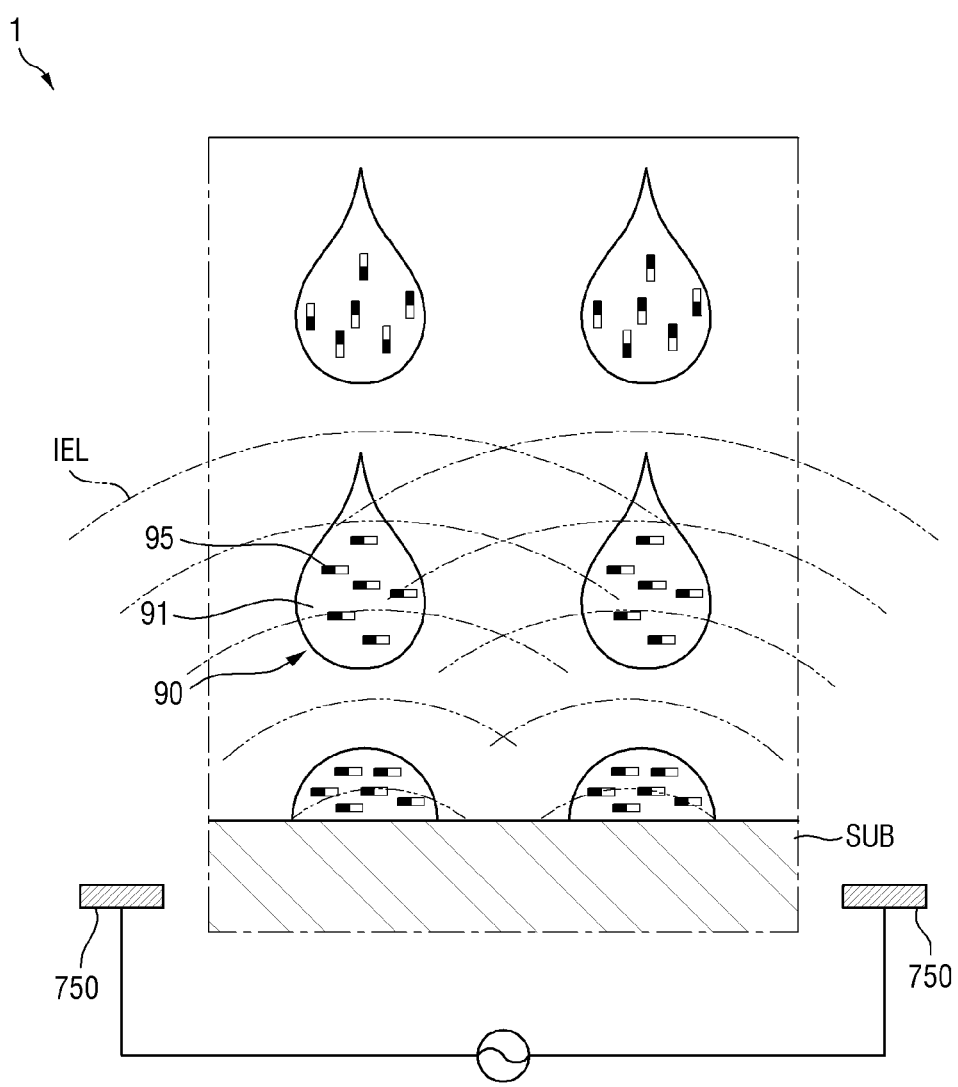
FIG. 12 is a schematic diagram showing that an electric field is generated on a target substrate under an operation of the probe device of FIG. 9 such that solid particles inside the ink are aligned with each other.

FIG. 9 is a schematic plan view of the probe device of the inkjet printing apparatus according to the embodiment of FIG. 1 as viewed in the third direction DR3. FIG. 10 and FIG. 11 are schematic diagrams showing an operation of the probe device 700 of FIG. 9. FIG. 12 is a schematic diagram showing that an electric field is generated on the target substrate SUB by the probe device of FIG. 9 and thus the solid particles inside the ink are aligned with each other.

Referring to FIGS. 9, 10, 11, and 12, the probe device 700 may include the sub-stage 710, a probe support structure 730, a probe unit 750 and an aligner 780.

The probe device 700 may be disposed on the stage STA, and may move along with the stage STA in the second direction DR2. The probe device 700 on which the target substrate SUB is disposed moves along with the stage STA, and the ink 90 may be sprayed on the substrate SUB. The probe device 700 may generate the electric field IEL on (or over) a top surface of the target substrate SUB in case that the ink 90 is sprayed on the substrate.

The sub-stage 710 may provide a space on which the target substrate SUB is placed or disposed. Further, on the sub-stage 710, the probe support structure 730, the probe unit 750, and the aligner 780 may be disposed.

At least one aligner 780 may be disposed on the sub-stage 710. The aligner 780 may be disposed on each of sides of the sub-stage 710. An area surrounded by the aligners 780 may be an area in which the target substrate SUB is disposed.

The probe support structure 730 and the probe unit 750 may be disposed on the sub-stage 710. The probe support structure 730 may provide a space on which the probe unit 750 is disposed with being disposed on the sub-stage 710. For example, the probe support structure 730 may be disposed on at least a side of the sub-stage 710 and extend along a direction in which a side of the sub-stage extends. In an example, as shown in the drawing, the probe support structure 730 may be disposed on each of left and right sides of the sub-stage 710 and may extend in the second direction DR2.

The probe unit 750 may be disposed on the probe support structure 730 so as to generate the electric field on the target substrate SUB prepared on the sub-stage 710. The probe unit 750 may extend in the second direction DR2 as the probe support structure 730 may, and an extension length of the probe unit may cover an entirety of the target substrate SUB.

The probe unit 750 may include a probe driver 753 disposed on the probe support structure 730, a probe zig 751, which is disposed on the probe driver 753 and receives an electrical signal, and a probe pad 758, which is connected to the probe zig 751 and transmits the electrical signal to the target substrate SUB.

The probe driver 753 may be disposed on the probe support structure 730 so as to move the probe zig 751 and the probe pad 758 in the third direction DR3. For example, the probe pad 758 may be connected to or disconnected from the target substrate SUB by the operation of the probe driver 753.

As shown in FIG. 11, the probe pad 758 may be connected to the probe zig 751 and may transmit the electric signal transmitted from the probe zig 751 to the target substrate SUB to generate the electric field IEL on (or over) the target substrate SUB. For example, the probe pad 758 may be in contact with an electrode or a power pad of the target substrate SUB, and thus the electrical signal of the probe zig 751 may be transmitted to the electrode or the power pad thereof.

The probe zig 751 may be connected to the probe pad 758 and may be connected to a voltage supply device as being separated. The probe zig 751 may transfer the electric signal transmitted from the voltage supply device to the probe pad 758 to generate the electric field IEL on (or over) the target substrate SUB. The electric signal transmitted to the probe zig 751 may be a voltage for generating the electric field IEL, for example, an alternating current (AC) voltage. There may be probe zigs 751. The number of probe zigs 751 is not limited particularly.

The ink 90 ejected from the nozzle 300 onto the target substrate SUB may include the bipolar elements 95. As described above, each of the bipolar elements 95 may include the first end portion and the second end portion having opposite polarities. In case that the bipolar elements 95 are located in a defined electric field, dielectrophoretic force may be transmitted thereto and thus positions or orientations of the bipolar elements may be changed. The bipolar elements 95 in the ink 90 sprayed onto the target substrate SUB may be seated or disposed on the target substrate SUB in case that the positions and orientations thereof are changed under the electric field IEL generated by the probe device 700 as shown in FIG. 12.

In an example, a timing at which the probe device 700 generates the electric field IEL on (or over) a top surface of the target substrate SUB is not particularly limited. Referring to FIG. 12, the probe unit 750 may generate the electric field IEL in case that the ink 90 is ejected from the nozzle 300 and reaches the target substrate SUB. Accordingly, the bipolar elements 95 may receive the dielectrophoretic force from the electric field IEL until the ink is ejected from the nozzle and reaches the target substrate SUB. In some embodiments, the probe unit 750 may generate the electric field IEL after the ink 90 has been seated or disposed on the target substrate SUB.

In an example, the inkjet printing apparatus 1 according to an embodiment may further include a heat-treating unit by which a process of volatilizing the ink 90 sprayed on the target substrate SUB is performed. The heat-treating unit may irradiate heat to the ink 90 sprayed on the target substrate SUB, so that the solvent 91 of the ink 90 may be volatilized and removed, and the bipolar elements 95 may remain on the target substrate SUB. Since the process of removing the solvent 91 by irradiating the ink 90 with the heat may be performed in a conventional heat-treating process, a detailed description thereof will be omitted for descriptive convenience.

In an example, the above-described bipolar elements 95 may be implemented as a light-emitting element 30 including semiconductor layers. For example, the inkjet printing apparatus 1 according to an embodiment may manufacture a display device 10 including the light-emitting element 30.

Hereinafter, the display device 10 including the light-emitting element 30 will be described.

Figure 13:
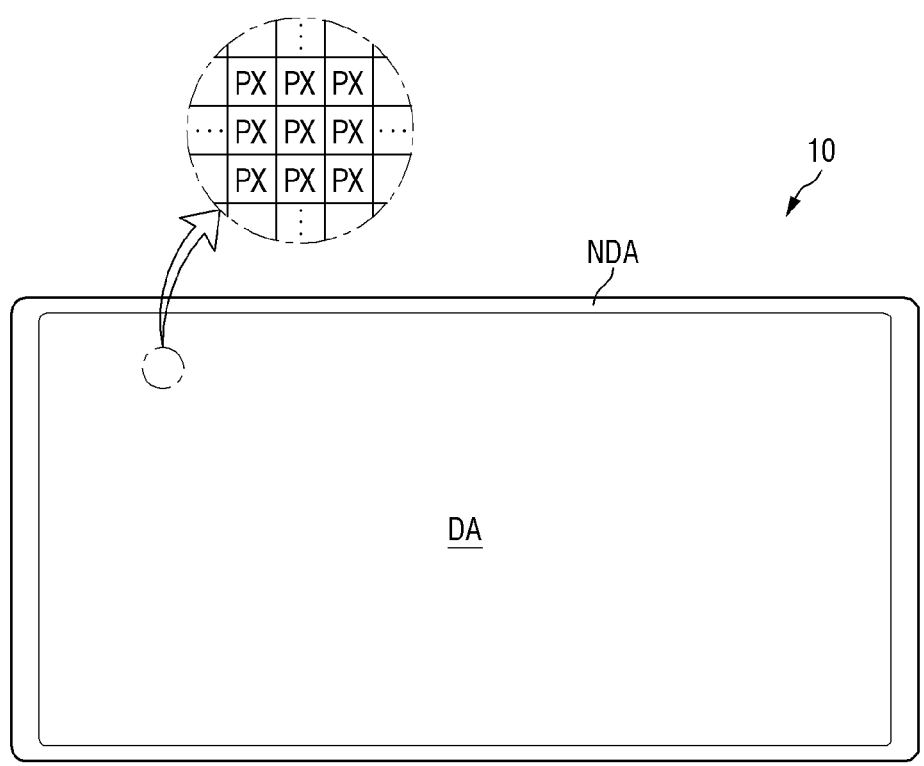
FIG. 13 is a schematic plan view of a display device according to an embodiment.
Figure 14:
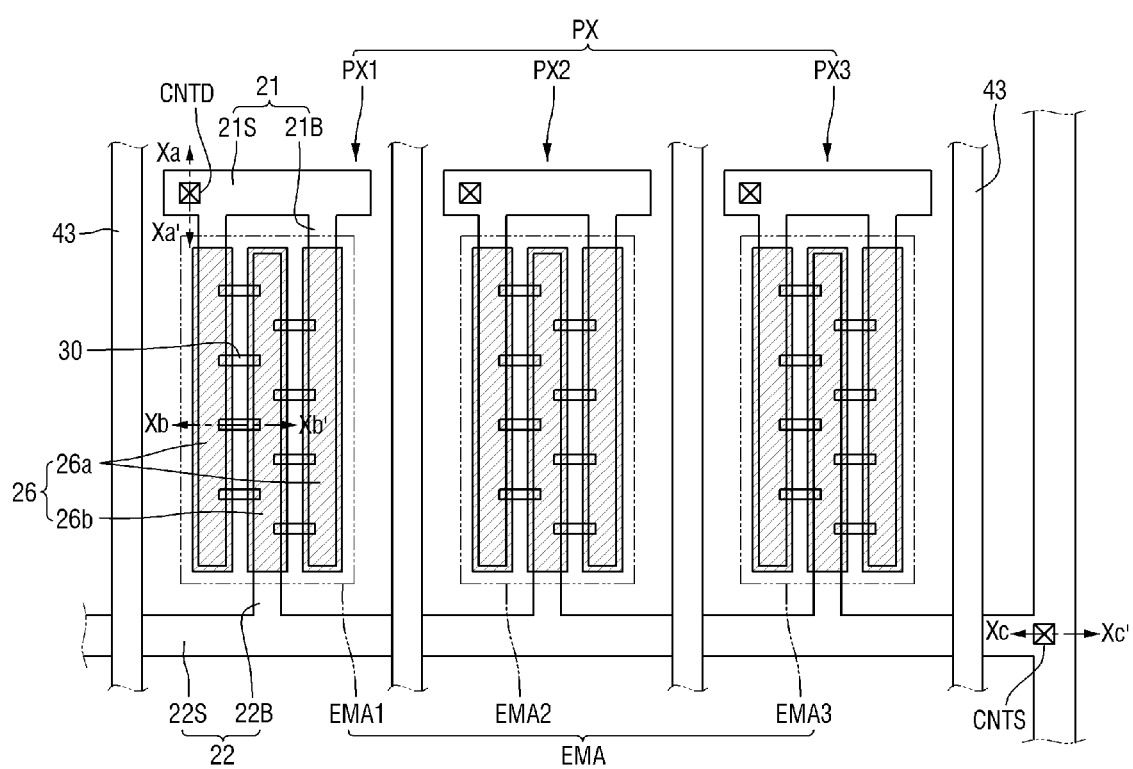
FIG. 14 is a schematic layout diagram showing a structure of a pixel of the display device according to the embodiment of FIG. 13.
Figure 15:
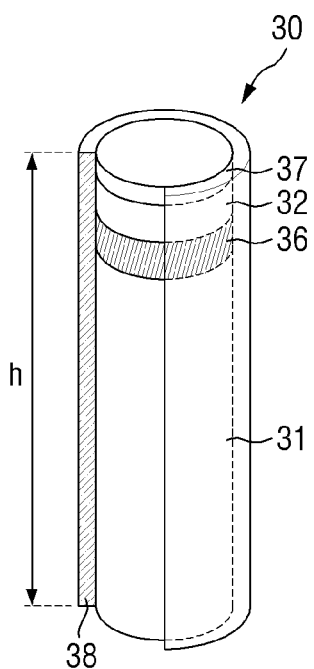
FIG. 15 is a schematic diagram of a light-emitting element of the display device according to the embodiment of FIG. 13.
Figure 16:
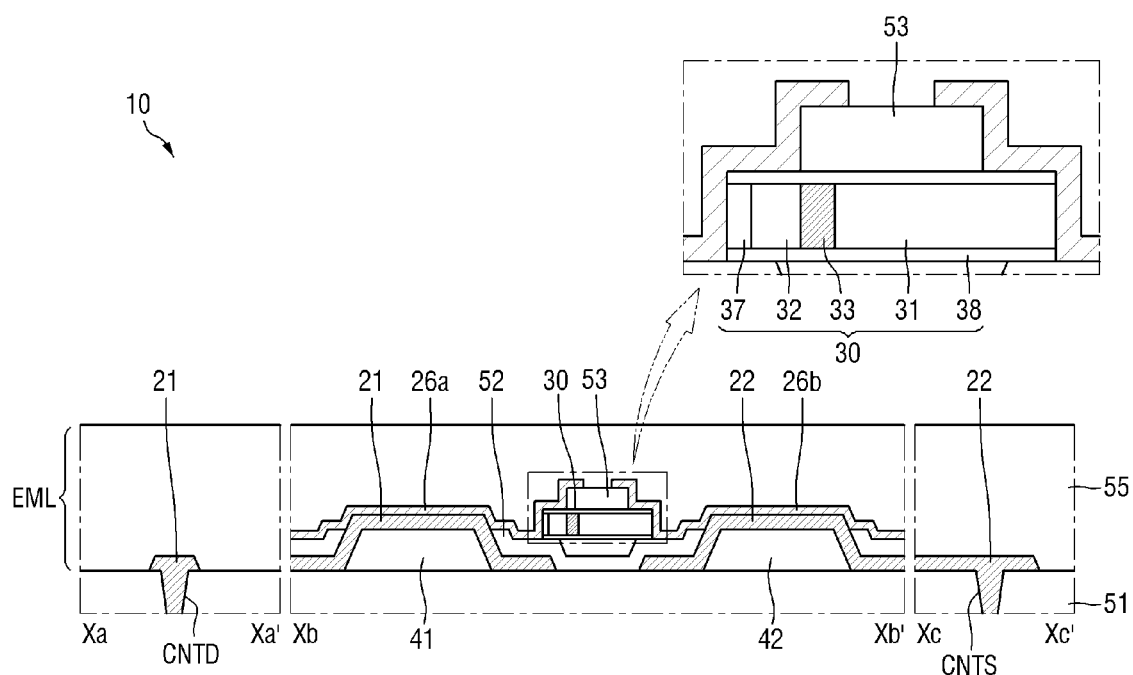
FIG. 16 is a schematic cross-sectional view taken along lines Xa-Xa', Xb-Xb', and Xc-Xc' in FIG. 14.
Figure 17:
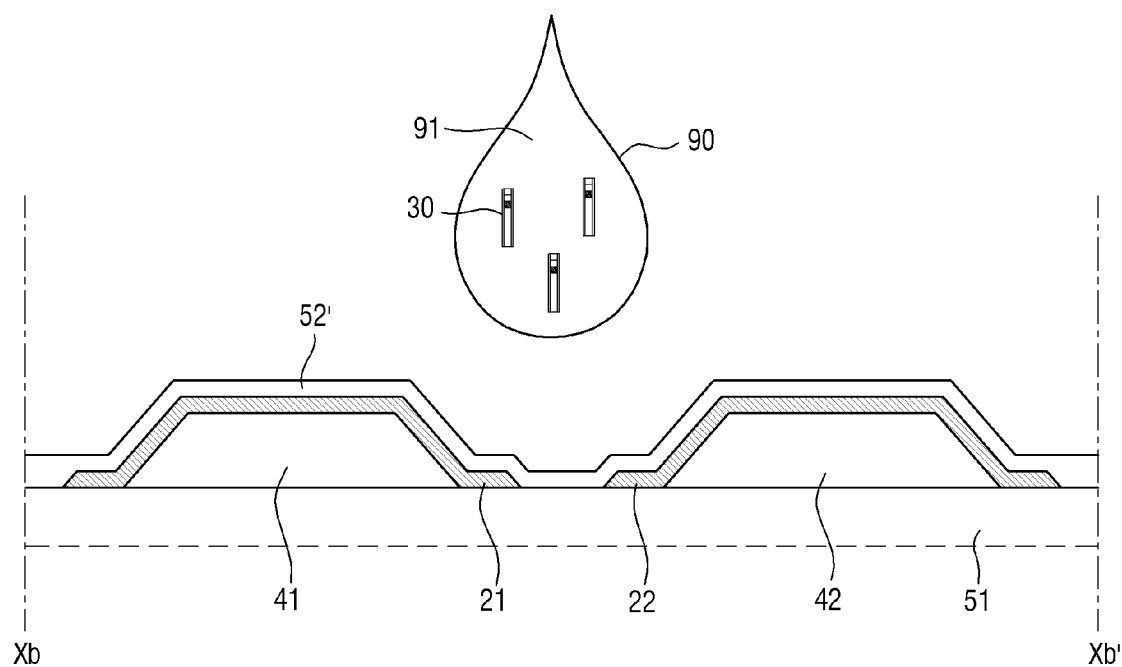
FIGS. 17, 18, and 19 are schematic diagrams illustrating a method for manufacturing a display device according to the embodiment of FIG. 13.
Figure 18:
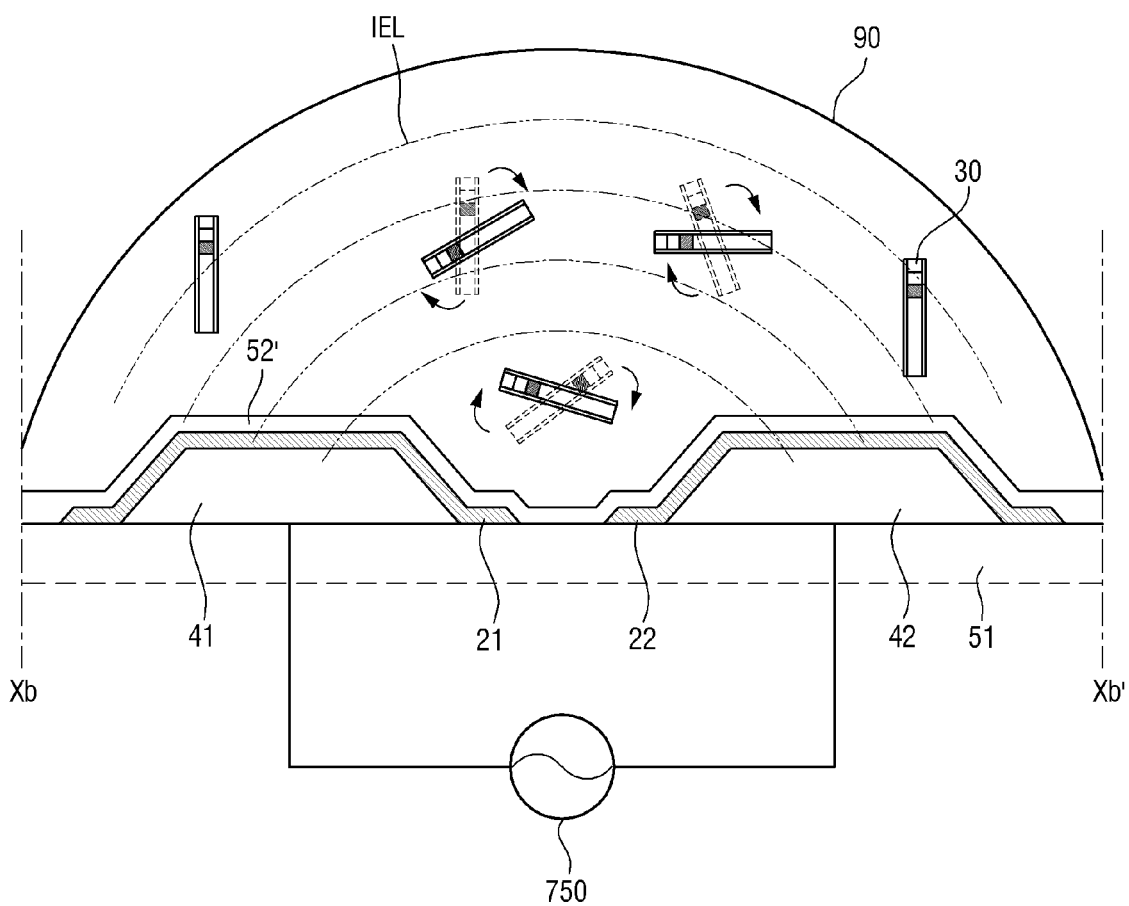
Figure 19:
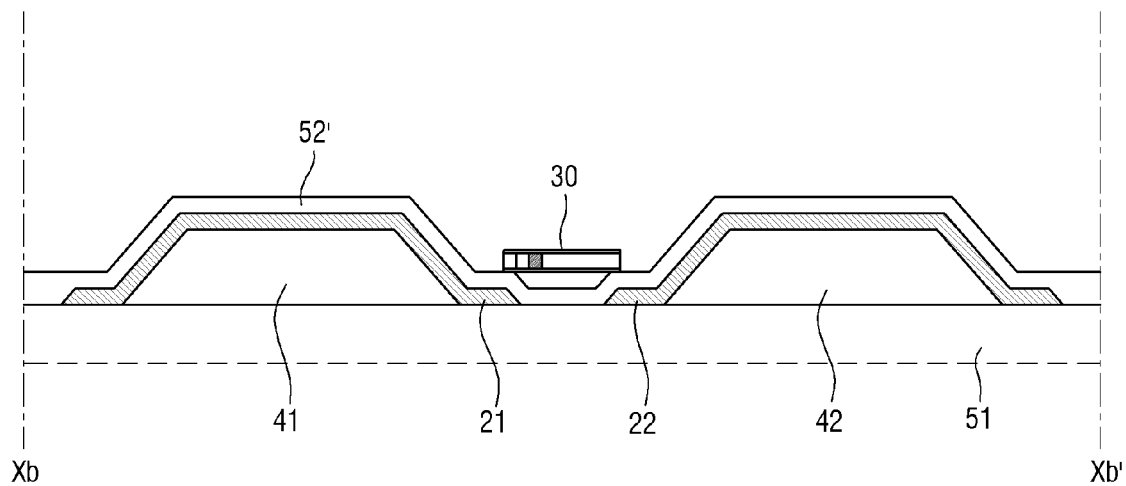

FIG. 13 is a schematic plan view of a display device according to an embodiment. FIG. 14 is a schematic layout diagram showing a structure of a pixel of the display device according to the embodiment of FIG. 13. FIG. 15 is a schematic diagram of a light-emitting element of the display device according to the embodiment of FIG. 13. FIG. 16 is a schematic cross-sectional view taken along lines Xa-Xa', Xb-Xb', and Xc-Xc' in FIG. 14. FIG. 17 to FIG. 19 are schematic diagrams illustrating a method for manufacturing a display device according to the embodiment of FIG. 13.

Referring to FIG. 13, a display device 10 according to an embodiment may refer to any electronic device that provides a display screen. For example, the display device 10 may include televisions, laptops, monitors, billboards, Internet of Things, mobile phones, smart phones, tablet PCs, electronic watches, smart watches, watch phones, head mounted displays, mobile communication terminals, electronic notebooks, electronic books, PMP (Portable Multimedia Player), navigation devices, game consoles, digital cameras, camcorders, etc. that may include a display screen.

A shape of the display device 10 may be variously modified. For example, the display device 10 may have a rectangle with a long horizontal side, a rectangle with a long vertical side, a square, a rectangle with rounded corners, other polygons, or a circle. A shape of a display area DA of the display device 10 may be similar to an overall shape of the display device 10. Referring to FIG. 13, each of the display device 10 and the display area DA may have a rectangular shape with a long horizontal side.

The display device 10 may include the display area DA and a non-display area NDA. The display area DA refers to an area where the screen may be displayed. The non-display area NDA refers to an area in which the screen is not displayed. The display area DA may be referred to as an active area, and the non-display area NDA may also be referred to as a non-active area.

The display area DA may occupy an inner area of the display device 10. The display area DA may include pixels PX. The pixels PX may be arranged in a matrix manner. A shape of each pixel PX may be a rectangle or a square in a schematic plan view, but embodiments are not limited thereto. For example, the shape of each pixel PX may have a rhombus shape with each side inclined relative to a direction. Each of the pixels PX may include at least one light-emitting element 30 that emits light in a specific wavelength band to display a specific color.

Referring to FIG. 14, each of the pixels PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, embodiments are not limited thereto. The sub-pixels PXn may emit light of the same color. For example, each of the pixels PX may include sub-pixels PXn (where n is a positive integer). Further, FIG. 14 illustrates that the pixel PX includes three sub-pixels PXn. However, embodiments are not limited thereto. The pixel PX may include a larger number of sub-pixels PXn.

Each of the sub-pixels PXn of the display device 10 may include an area defined as a light-emitting area EMA. The first sub-pixel PX1 may include a first light-emitting area EMA1, the second sub-pixel PX2 may include a second light-emitting area EMA2, and the third sub-pixel PX3 may include a third light-emitting area EMA3. The light-emitting area EMA may be defined as an area where the light-emitting element 30 included in the display device 10 is disposed to emit light of a specific wavelength band.

Each of the sub-pixels PXn of the display device 10 may include a non-light-emitting area defined as an area other than the light-emitting area EMA. The non-light-emitting area may be an area in which the light-emitting element 30 is not disposed and an area in which the light emitted from the light-emitting element 30 does not reach. Thus, the non-light-emitting area may not emit any light therefrom.

Each of the sub-pixels PXn of the display device 10 may include electrodes 21 and 22, a light-emitting element 30, inner banks 41 and 42 and an outer bank 43 and at least one insulating layer as shown in FIG. 16. Contact electrodes 26 may be disposed on the light-emitting element 30 after the light-emitting element 30 has been disposed. Hereinafter, the display device 10 will be described based on a state before the contact electrodes 26 are disposed on the light-emitting element 30.

The electrodes 21 and 22 may be connected (e.g., electrically connected) to the light-emitting elements 30, and a voltage (e.g., a specific voltage) may be applied thereto so that the light-emitting elements 30 emit light in a specific wavelength band. Further, at least one of the electrodes 21 and 22 may be used to generate an electric field within the sub-pixels PXn to align the light-emitting element 30.

The electrodes 21 and 22 may include the first electrode 21 and the second electrode 22. In an embodiment, the first electrode 21 may be pixel electrodes for the sub-pixels PXn, which are separated from each other, and the second electrode 22 may be a common electrode commonly connected to the sub-pixels PXn. For example, one of the first electrode 21 and the second electrode 22 may be an anode electrode of the light-emitting element 30, and another one of the first electrode 21 and the second electrode 22 may be a cathode electrode of the light-emitting element 30. However, embodiments are not limited thereto and vice versa.

The first electrode 21 and the second electrode 22 may respectively include electrode stems 21S and 22S extending in a horizontal direction and electrode branches 21B and 22B branched from the electrodes stems 21S and 22S and extending in a vertical direction intersecting the horizontal direction (e.g., in a plan view).

The first electrode 21 may include the first electrode stem 21S extending in the horizontal direction and the first electrode branch 21B branched from the first electrode stem 21S and extending in the vertical direction (e.g., in a plan view).

Each of opposite end portions (e.g., both distal ends) of the first electrode stem 21S of a sub-pixel may be spaced apart from each of opposite end portions (e.g., both distal ends) of the first electrode stem 21S of another sub-pixel adjacent to the sub-pixel in the horizontal direction. Thus, different electrical signals may be applied to the first electrode branches 21B, and each of the first electrode branches 21B may operate separately or independently. For example, the end portions (e.g., the distal ends) of the first electrode stems 21S of the sub-pixels in the same row (e.g., sub-pixels arranged in the horizontal direction) may be aligned with each other in substantially the same straight line.

The first electrode branch 21B may be branched from at least a portion of the first electrode stem 21S and may extend in the vertical direction. An end portion (e.g., a distal end) of the first electrode branch 21B may be spaced apart from the second electrode stem 22S facing the first electrode stem 21S.

The second electrode 22 may include the second electrode stem 22S extending in the horizontal direction and spaced apart from the first electrode stem 21S in the vertical direction so as to face the second electrode stem 21S, and the second electrode branch 22B which branches from the second electrode stem 22S and extends in the vertical direction. The second electrode stems 22S of the sub-pixels PXn adjacent to each other in the horizontal direction may be connected to each other. For example, unlike the first electrode stem 21S, the second electrode stem 22S may extend in the horizontal direction and may extend across the sub-pixels PXn arranged horizontally (e.g., in a plan view). The second electrode stem 22S extending across the sub-pixels PXn arranged horizontally may be connected to an outer portion of the display area DA in which each pixel PX or the sub-pixels PXn are disposed, or a portion extending in a direction from the non-display area NDA.

The second electrode branch 22B may be spaced apart from and face the first electrode branch 21B, and may be terminated so as to be spaced apart from the first electrode stem 21S. The second electrode branch 22B may be connected to the second electrode stem 22S, and an end portion of the second electrode branch 22B in the extending direction may be disposed in the sub-pixels PXn with being spaced apart from the first electrode stem 21S.

The first electrode 21 and the second electrode 22 may be connected (e.g., electrically connected) to a circuit element layer CCL of the display device 10 via contact holes, for example, a first electrode contact hole CNTD and a second electrode contact hole CNTS, respectively. Referring to FIG. 16, the first electrode contact hole CNTD may be formed for each of the first electrode stem 21S of each of the sub-pixels PXn, and the second electrode contact hole CNTS is formed in the second electrode stem 22S horizontally extending across the sub-pixels PXn arranged in the horizontal direction. However, embodiments are not limited thereto, for example, the second electrode contact hole CNTS may be formed for each of the sub-pixels PXn.

Referring to FIG. 12, the outer bank 43 may be disposed at a boundary area between the sub-pixels PXn, in case that the inner banks 41 and 42 are disposed adjacent to a central portion of each of the sub-pixels PXn and respectively disposed under the first and second electrodes 21 and 22. For example, the first inner bank 41 and the second inner bank 42 may be disposed under the first electrode branch 21B and the second electrode branch 22B, respectively.

The outer bank 43 may be placed or disposed at a boundary area between the sub-pixels PXn. Each of the first electrode stems 21S may be terminated to have an end portion (e.g., a distal end) spaced apart from the outer bank 43. The outer bank 43 may extend in the vertical direction and may be disposed at the boundary area between the sub-pixels PXn arranged in the horizontal direction. However, embodiments are not limited thereto, and the outer bank 43 may extend in the horizontal direction and may also be disposed at a boundary area between the sub-pixels PXn arranged in the vertical direction (e.g., in a plan view). The outer bank 43 and the inner banks 41 and 42 may include the same material such that the outer bank 43 and the inner banks 41 and 42 may be formed simultaneously in a process.

The light-emitting element 30 may be disposed between the first electrode 21 and the second electrode 22. An end portion of the light-emitting element 30 may be connected (e.g., electrically connected) to the first electrode 21 and another end portion thereof may be connected (e.g., electrically connected) to the second electrode 22. The light-emitting element 30 may be connected (e.g., electrically connected) to each of the first electrode 21 and the second electrode 22 via a contact electrode 26 to be described below.

The light-emitting elements 30 may be arranged to be spaced apart from each other and may be aligned with each other in substantially parallel to each other. A spacing between the adjacent light-emitting elements 30 is not particularly limited. In some embodiments, the light-emitting elements 30 may be arranged adjacent to each other to constitute a group. Some of the light-emitting elements 30 may be spaced from each other by a constant spacing and may have non-uniform arrangement density, and may be aligned and oriented with each other in a direction. Further, in an embodiment, the light-emitting element 30 may have a shape extending in a direction such that a direction, in which each of the electrodes thereof, for example, each of the first electrode branch 21B and the second electrode branch 22B extends, may be substantially perpendicular to in the direction in which the light-emitting element 30 extends. However, embodiments are not limited thereto, and the direction, in which each of the first electrode branch 21B and the second electrode branch 22B extends, may be inclined relative to the direction in which the light-emitting element 30 extends.

The light-emitting element 30 may be a light-emitting diode. For example, the light-emitting element 30 may be an inorganic light-emitting diode, which has a size of a micrometer scale or a nanometer scale and is made of an inorganic material. The inorganic light-emitting diodes may be disposed between the two electrodes facing each other and may be aligned with each other under an electric field generated in a specific direction between the two electrodes. The light-emitting elements 30 may be disposed between the electrodes and may be aligned with each other under the electric field generated between the two electrodes.

The light-emitting element 30 according to an embodiment may have a shape extending in a direction. The light-emitting element 30 may have a shape such as a rod, a wire, or a tube. In an embodiment, the light-emitting element 30 may have a cylindrical shape or a rod shape. However, the shape of the light-emitting element 30 is not limited thereto, and may have a shape of a polygonal prism such as a cube, a cuboid, or a hexagonal prism. In another example, the light-emitting element 30 may have a shape which extends in a direction but has an inclined outer surface (e.g., a partially inclined outer surface). Semiconductors included in the light-emitting element 30 to be described below may be sequentially arranged in a direction or may have a stack structure.

The light-emitting element 30 may include a semiconductor layer doped with any conductivity type e.g., p-type or n-type impurities. The semiconductor layer may emit light in a specific wavelength band by receiving an electrical signal applied from an external power source.

Referring to FIG. 15, the light-emitting element 30 may include a first semiconductor layer 31, a second semiconductor layer 32, an active layer 36, an electrode layer 37, and an insulating film 38.

The first semiconductor layer 31 may be made of an n-type semiconductor. In an example, in case that the light-emitting element 30 emits light in a blue wavelength band, the first semiconductor layer 31 may include a semiconductor material of Chemical Formula $Al_xGa_yIn_{1-x-y}N$ ($0 \leq x \leq 1$, $0 \leq y \leq 1$, $0 \leq x+y \leq 1$). For example, the first semiconductor layer 31 may include at least one of AlGaInN, GaN, AlGaN, InGaN, AlN, and InN doped with n-type impurities. The first semiconductor layer 31 may be doped with an n-type dopant. In an example, the n-type dopant may be Si, Ge, Sn, or the like. In an embodiment, the first semiconductor layer 31 may be made of n-GaN doped with n-type Si. A length of the first semiconductor layer 31 may be in a range from about 1.5 μm to about 5 However, embodiments are not limited thereto.

The second semiconductor layer 32 is disposed on the active layer 36 to be described below. The second semiconductor layer 32 may be made of a p-type semiconductor. In an example, in case that the light-emitting element 30 emits light in a blue or green wavelength band, the second semiconductor layer 32 may include a semiconductor material with a chemical formula of $Al_xGa_yIn_{1-x-y}N$ ($0 \leq x \leq 1$, $0 \leq y \leq 1$ and $0 \leq x+y \leq 1$). For example, the second semiconductor layer 32 may include any one or more of AlGaInN, GaN, AlGaN, InGaN, AlN, and InN doped with p-type impurities. The second semiconductor layer 32 may be doped with a p-type dopant. In an example, the p-type dopant may be Mg, Zn, Ca, Se, Ba, or the like. In an embodiment, the second semiconductor layer 32 may be made of p-GaN doped with p-type Mg. A length of the second semiconductor layer 32 may in a range from about 0.05 μm to about 0.10 μm. However, embodiments are not limited thereto.

In an example, referring to FIG. 15, each of the first semiconductor layer 31 and the second semiconductor layer 32 may be implemented as a single layer. However, embodiments are not limited thereto. According to some embodiments, according to a material of the active layer 36, each of the first semiconductor layer 31 and the second semiconductor layer 32 may include a larger number of layers, and may further include, for example, a clad layer or a TSBR (tensile strain barrier reducing) layer.

The active layer 36 may be disposed between the first semiconductor layer 31 and the second semiconductor layer 32. The active layer 36 may include a material of a single or multiple quantum well structure. In case that the active layer 36 includes a material of a multi-quantum well structure, quantum layers and well layers may be alternately stacked with each other. The active layer 36 may emit light in case that electrons and holes are combined with each other therein based on an electrical signal applied thereto through the first semiconductor layer 31 and the second semiconductor layer 32. In an example, in case that the active layer 36 emits light in a blue wavelength band, the active layer may include a material such as AlGaN or AlGaInN. For example, in case that the active layer 36 has a multi-quantum well structure in which the quantum layers and the well layers are alternately stacked with each other, the quantum layer may include a material such as AlGaN or AlGaInN, and the well layer may include a material such as GaN or AlInN. In an embodiment, the active layer 36 may include AlGaInN as a material of the quantum layer and AlInN as a material of the well layer, as described above. For example, the active layer 36 may emit blue light having a central wavelength band in a range of about 450 nm to about 495 nm.

However, embodiments are not limited thereto. The active layer 36 may have a structure in which a layer made of a semiconductor material having a large bandgap energy and a layer made of a semiconductor material having a small bandgap energy are alternately stacked. The active layer 35 may include group III to V semiconductor materials based on a wavelength band of the emitted light. The light emitted from the active layer 36 is not limited to light in a blue wavelength band, and in some embodiments, light in a red or green wavelength band may be emitted therefrom. A length of the active layer 36 may be in a range of 0.05 μm to 0.10 μm. However, embodiments are not limited thereto.

In an example, the light emitted from the active layer 36 may be emitted not only toward a lengthwise outer surface of the light-emitting element 30, but also toward opposite side surfaces. Directionality of the light emitted from the active layer 36 is not limited to a direction.

The electrode layer 37 may be an Ohmic contact electrode. However, embodiments are not limited thereto. For example, the electrode layer 37 may be a Schottky contact electrode. The light-emitting element 30 may include at least one electrode layer 37. Referring to FIG. 15, the light-emitting element 30 may include an electrode layer 37. However, embodiments are not limited thereto. In some embodiments, the light-emitting element 30 may include a greater number of electrode layers 37. In another example, the electrode layers 37 may be omitted. Description of the light-emitting element 30 to be made below may be similarly applied to a case that the number of the electrode layers 37 varies or another component is further included therein.

The electrode layer 37 may reduce resistance between the light-emitting element 30 and the electrode or the contact electrode in case that the light-emitting element 30 is connected (e.g., electrically connected) to the electrode or the contact electrode in the display device 10 according to an embodiment. The electrode layer 37 may include a conductive metal. For example, the electrode layer 37 may include at least one of aluminum (Al), titanium (Ti), indium (In), gold (Au), silver (Ag), ITO (Indium Tin Oxide), IZO (Indium Zinc Oxide), and ITZO (Indium Tin-Zinc Oxide). Further, the electrode layer 37 may include an n-type or p-type dopant doped semiconductor material. The electrode layers 37 may include the same material, or may include different materials. Embodiments are not limited thereto.

The insulating film 38 may be disposed to surround an outer surface of each of the semiconductor layers and the electrode layers as described above. In an embodiment, the insulating film 38 may be disposed to surround the outer surface of the at least active layer 36, and may extend in a length direction in which the light-emitting element 30 extends. The insulating film 38 may function to protect the members. In an example, the insulating film 38 may be formed to surround side surfaces of the members such that opposite ends in the length direction of the light-emitting element 30 may be exposed.

Referring to FIG. 15, the insulating film 38 may be formed to extend in the length direction of the light-emitting element 30 so as to cover the first semiconductor layer 31 and the side surface of the electrode layer 37. However, embodiments are not limited thereto. The insulating film 38 may cover only the outer surface of some of the semiconductor layers including the active layer 36 or cover only a portion of the outer surface of electrode layer 37 so that an outer surface of each of the electrode layers 37 may be exposed (e.g., partially exposed). Further, the insulating film 38 may be formed to have a round top surface in a cross section in an area adjacent to at least one end portion of the light-emitting element 30.

A thickness of the insulating film 38 may be in a range of about 10 nm to about 1.0 μm. However, embodiments are not limited thereto. For example, the thickness of the insulating film 38 may be about 40 nm.

The insulating film 38 may be made of a material with insulating ability, such as silicon oxide ($SiO_x$), silicon nitride ($SiN_x$), silicon oxynitride ($SiO_xN_y$), aluminum nitride (AlN), aluminum oxide ($Al_2O_3$), etc. The insulating film 38 may prevent an electrical short circuit that may occur in case that the active layer 36 is in direct contact with an electrode through which an electrical signal is transmitted to the light-emitting element 30. Further, the insulating film 38 may protect the outer surface of the light-emitting element 30 including the active layer 36, thereby preventing deterioration of the light-emitting efficiency.

Further, in some embodiments, the outer surface of the insulating film 38 may be surface-treated. The light-emitting elements 30 may be sprayed onto the electrode in a state of being dispersed in the ink 90 during manufacturing of the display device 10 and may be aligned with each other. In this regard, in order that the light-emitting elements 30 are maintained in the dispersed state and are not aggregated with each other in the ink 90, a surface of the insulating film 38 may be treated to have hydrophobicity or hydrophilicity.

The light-emitting element 30 may have a length h in a range of about 1 μm to about 10 μm or in a range of about 2 μm to about 6 μm, and may have a length in a range of about 3 μm to about 5 μm. Further, a diameter of the light-emitting element 30 may be in a range of about 30 nm to about 700 nm, and an aspect ratio of the light-emitting element 30 may be in a range of about 1.2 to about 100. However, embodiments are not limited thereto. The light-emitting elements 30 included in the display device 10 may have a diameter varying according to a variation in a composition of the active layer 36. For example, the diameter of the light-emitting element 30 may have about 500 nm.

The light-emitting element 30 according to an embodiment may include an active layer 36 including a material, which is variously selected so as to emit light of a varying wavelength band to an outside. In the display device 10, the light-emitting element 30 of the first sub-pixel PX1 may emit first light with the first wavelength in a center wavelength band thereof, and the light-emitting element 30 of the second sub-pixel PX2 may emit second light with the second wavelength in a center wavelength band thereof, and the light-emitting element 30 of the third sub-pixel PX3 may emit third light having a third wavelength in a central wavelength band thereof. Accordingly, the first light may be emitted from the first sub-pixel PX1, the second light may be emitted from the second sub-pixel PX2, and the third light may be emitted from the third sub-pixel PX3. In some embodiments, the first light may be blue light having a central wavelength band in a range of about 450 nm to about 495 nm. The second light may be green light with a central wavelength band in a range of about 495 nm to about 570 nm. The third light may be red light having a central wavelength band in a range of about 620 nm to about 750 nm. However, embodiments are not limited thereto.

FIG. 16 shows a cross section of the first sub-pixel PX1. However, a principle of FIG. 16 may be similarly applied to another pixel PX or sub-pixels PXn. FIG. 16 shows a schematic cross-section view illustrating from an end portion to another end portion of the light-emitting element 30 placed or disposed in the first sub-pixel PX1.

In an example, the display device 10 may further include a circuit element layer positioned below each of the electrodes 21 and 22. The circuit element layer may include semiconductor layers and conductive pattern layers, and may include at least one transistor and a power line. However, a detailed description thereof will be omitted below.

Referring to FIG. 14 and FIG. 16, the display device 10 may include a first insulating layer 51, and the electrodes 21 and 22 and the light-emitting element 30 disposed on the first insulating layer 51. A circuit element layer may be disposed under the first insulating layer 51. The first insulating layer 51 may include an organic insulating material and thus perform a surface planarization function.

The inner banks 41 and 42, the outer bank 43, the electrodes 21 and 22, and the light-emitting element 30 may be disposed on the first insulating layer 51.

In case that the ink 90 in which the light-emitting elements 30 are dispersed is sprayed using the inkjet printing apparatus 1 (see, e.g., FIG. 1) as described above during the manufacturing of the display device 10, the outer bank 43 may prevent the ink from overflowing a boundary area between adjacent sub-pixels PXn. The outer bank 43 may physically separate the different light-emitting elements 30 of different sub-pixels PXn from each other so that different inks 90 of the different sub-pixels PXn may not mix with each other. However, embodiments are not limited thereto.

The inner banks 41 and 42 may include the first inner bank 41 and the second inner bank 42 disposed adjacent to a center of each of the sub-pixels PXn.

The first inner bank 41 and the second inner bank 42 are spaced apart from each other and disposed to face each other. The first electrode 21 may be disposed on the first inner bank 41, and the second electrode 22 may be disposed on the second inner bank 42. Referring to FIGS. 2 and 4, it may be understood that the first electrode branch 21B is disposed on the first inner bank 41, and the second electrode branch 22B is disposed on the second inner bank 42.

The first inner bank 41 and the second inner bank 42 may extend in the vertical direction and within each of the sub-pixels PXn (e.g., in a plan view). However, embodiments are not limited thereto, and the first inner bank 41 and the second inner bank 42 may be disposed in each of the sub-pixels PXn and constitute a pattern formed on an entire surface of the display device 10. Each of the inner banks 41, 42 and the outer bank 43 may include polyimide (PI), but embodiments are not limited thereto.

Each of the first inner bank 41 and the second inner bank 42 may have a structure in which at least a portion thereof protrudes from the first insulating layer 51. Each of the first inner bank 41 and the second inner bank 42 may protrude upwardly from a plane in which the light-emitting element 30 is disposed. At least a portion of the protruding portion may have an inclination. Since each of the inner banks 41 and 42 protrudes from the first insulating layer 51 and has an inclined side surface, light emitted from the light-emitting element 30 may be reflected from the inclined side surfaces of the inner banks 41 and 42. As will be described below, in case that each of the electrodes 21 and 22 disposed on the inner banks 41 and 42 includes a material with high reflectivity, light emitted from light-emitting element 30 may be reflected from the electrodes 21 and 22 and may travel upwardly of the first insulating layer 51.

The outer bank 43 may be disposed at the boundary area between the sub-pixels PXn so as to constitute a grid pattern, in case that each of the inner banks 41 and 42 is disposed within each of the sub-pixels PXn and has a shape extending in a direction.

The electrodes 21 and 22 may be disposed on the first insulating layer 51 and inner banks 41 and 42, respectively. As described above, the electrodes 21 and 22 may include the electrode stems 21S and 22S and the electrode branches 21B and 22B, respectively.

A partial area of each of the first electrode 21 and the second electrode 22 may be disposed on the first insulating layer 51, in case that partial areas of the first electrode 21 and the second electrode 22 are respectively disposed on the first inner bank 41 and the second inner bank 42. As described above, the first electrode stem 21S of the first electrode 21 and the second electrode stem 22S of the second electrode 22 may extend in the horizontal direction, and the first inner bank 41 and the second inner bank 42 may extend in the vertical direction and may extend across the sub-pixels PXn arranged in the vertical direction (e.g., in a plan view).

The first electrode contact hole CNTD extending through the first insulating layer 51 so as to expose a portion of the circuit element layer CCL may be formed in the first electrode stem 21S of the first electrode 21. The first electrode 21 may be connected (e.g., electrically connected) to a transistor of the circuit element layer CCL via the first electrode contact hole CNTD. The first electrode 21 may receive an electrical signal from the transistor.

The second electrode stem 22S of the second electrode 22 may extend in a direction so as to be disposed in a non-light-emitting area where the light-emitting elements 30 are not disposed. The second electrode contact hole CNTS extending through the first insulating layer 51 so as to expose a portion of the circuit element layer CCL may be formed in the second electrode stem 22S. The second electrode 22 may be connected (e.g., electrically connected) to a power electrode via the second electrode contact hole CNTS. The second electrode 22 may receive an electrical signal from the power electrode.

Partial areas of the first electrode 21 and the second electrode 22, for example, the first electrode branch 21B and the second electrode branch 22B may be disposed on the first inner bank 41 and the second inner bank 42, respectively. Light-emitting elements 30 may be disposed in an area between the first electrode 21 and the second electrode 22, e.g., in a space by which the first electrode branch 21B and the second electrode branch 22B are spaced apart from each other so as to face each other.

Each of the electrodes 21 and 22 may include a transparent conductive material. In an example, each of the electrodes 21 and 22 may include a material such as ITO (Indium Tin Oxide), IZO (Indium Zinc Oxide), ITZO (Indium Tin-Zinc Oxide). However, embodiments are not limited thereto. In some embodiments, each of the electrodes 21 and 22 may include a conductive material having high reflectivity. For example, each of the electrodes 21 and 22 may include metals such as silver (Ag), copper (Cu), aluminum (Al), etc. as a material with high reflectivity. For example, the light incident to each of the electrodes 21 and 22 may be reflected therefrom and may be emitted upwardly of each of the sub-pixels PXn.

Further, each of the electrodes 21 and 22 may have a structure in which at least one layer made of a transparent conductive material and at least one layer made of a metal having high reflectance are stacked with each other, or may be formed as a single layer including the transparent conductive material and the metal having high reflectance. In an embodiment, each of the electrodes 21 and 22 may have a stacked structure of ITO/silver (Ag)/ITO/IZO, or may be made of an alloy including aluminum (Al), nickel (Ni), lanthanum (La), and the like. However, embodiments are not limited thereto.

The second insulating layer 52 may be disposed on the first insulating layer 51, the first electrode 21 and the second electrode 22. The second insulating layer 52 may be disposed to cover (e.g., partially cover) the first electrode 21 and the second electrode 22. The second insulating layer 52 may be disposed to cover a substantial portion of a top surface of each of the first electrode 21 and the second electrode 22 and to expose a portion of each of the first electrode 21 and the second electrode 22. The second insulating layer 52 may be disposed such that a portion of the top surface of each of the first electrode 21 and the second electrode 22, for example, a portion of the top surface of the first electrode branch 21B disposed on the first inner bank 41, and a portion of the top surface of the second electrode branch 22B disposed on the second inner bank 42 may be exposed. For example, the second insulating layer 52 may be formed on substantially an entire surface of the first insulating layer 51, and may include an opening exposing (e.g., partially exposing) the first electrode 21 and the second electrode 22.

In an embodiment, a step may be formed on the second insulating layer 52 such that a portion of a top surface of the second insulating layer 52 between the first electrode 21 and the second electrode 22 may be recessed. In some embodiments, the second insulating layer 52 may include an inorganic insulating material, and a portion of the top surface of the second insulating layer 52 disposed to cover the first electrode 21 and the second electrode 22 may be recessed due to a step of the member disposed thereunder. An empty space may be defined between the light-emitting element 30 disposed on the second insulating layer 52 and between the first electrode 21 and the second electrode 22 and the recessed top surface of the second insulating layer 52. The light-emitting element 30 may be spaced (e.g., partially spaced) apart from the top surface of the second insulating layer 52. A material constituting the third insulating layer 53 which will be described below may fill the empty space. However, embodiments are not limited thereto. The second insulating layer 52 may have a flat top surface on which the light-emitting element 30 is disposed.

The second insulating layer 52 may protect the first electrode 21 and the second electrode 22 and may at the same time electrically insulate the first electrode 21 and the second electrode 22 from each other. Further, the second insulating layer 52 may prevent the light-emitting element 30 disposed on the second insulating layer 52 from being damaged due to direct contact with other members. However, a shape and a structure of the second insulating layer 52 are not limited thereto.

The light-emitting element 30 may be disposed on the second insulating layer 52 and between the electrodes 21 and 22. For example, at least one light-emitting element 30 may be disposed on the second insulating layer 52 and disposed between the electrode branches 21B and 22B. However, embodiments are not limited thereto. For example, at least some of the light-emitting elements 30 disposed in each of the sub-pixels PXn may be disposed in an area other than the area between the electrode branches 21B and 22B. The light-emitting element 30 may be disposed on an end portion of the first electrode branch 21B and an end portion of the second electrode branch 22B facing each other, and may be connected (e.g., electrically connected) to each of the electrodes 21 and 22 via the contact electrode 26.

Layers of the light-emitting element 30 may be arranged in a horizontal direction parallel to the first insulating layer 51. The light-emitting element 30 of the display device 10 according to an embodiment may have a shape extending in a length direction, and may have a structure in which the semiconductor layers thereof are sequentially arranged in the length direction. As described above, the light-emitting element 30 may have a structure in which the first semiconductor layer 31, the active layer 36, the second semiconductor layer 32, and the electrode layer 37 are sequentially arranged along the length direction, and the insulating film 38 may surround the outer surfaces thereof. The light-emitting element 30 disposed in the display device 10 may extend in the length direction parallel to the first insulating layer 51. The semiconductor layers included in the light-emitting element 30 may be sequentially arranged in the direction parallel to a top surface of the first insulating layer 51. However, embodiments are not limited thereto. In some embodiments, in case that the light-emitting element 30 has a different structure, layers may be arranged in a direction perpendicular to the first insulating layer 51.

Further, an end portion of the light-emitting element 30 may contact a first contact electrode 26a, and another end portion thereof may contact a second contact electrode 26b. According to an embodiment, since the insulating film 38 is not formed on a surface of an end portion in the extension direction of the light-emitting element 30 and thus the surface of an end portion thereof is exposed, the first contact electrode 26a and the second contact electrode 26b as described below may contact the exposed surface of the end portion of the light-emitting element 30. However, embodiments are not limited thereto. In some embodiments, at least a partial area of the insulating film 38 of the light-emitting element 30 may be removed so that opposite end side surfaces of the light-emitting element 30 may be exposed (e.g., partially exposed).

The third insulating layer 53 may be disposed (e.g., partially disposed) on the light-emitting element 30 and between the first electrode 21 and the second electrode 22. The third insulating layer 53 may be disposed to cover (e.g., partially cover) the outer surface of the light-emitting element 30. The third insulating layer 53 may protect the light-emitting element 30 and perform a function of fixing the light-emitting element 30 in the manufacturing process of the display device 10. Further, in an embodiment, a portion of a material of the third insulating layer 53 may be disposed between a bottom surface of the light-emitting element 30 and the second insulating layer 52. As described above, the third insulating layer 53 may be formed to fill the space disposed between the second insulating layer 52 and the light-emitting element 30 and defined during the manufacturing process of the display device 10. Accordingly, the third insulating layer 53 may be formed to surround an outer surface of the light-emitting element 30. However, embodiments are not limited thereto.

The third insulating layer 53 may extend in the vertical direction with being disposed between the first electrode branch 21B and the second electrode branch 22B (e.g., in a plan view). In an example, the third insulating layer 53 may have an island shape or a linear shape in a plan view and may be disposed on the first insulating layer 51. According to an embodiment, the third insulating layer 53 may be disposed on a top surface of the light-emitting element 30.

The first contact electrode 26a and the second contact electrode 26b may be disposed on the electrodes 21 and 22, respectively, and on the third insulating layer 53. Portions of the first contact electrode 26a and the second contact electrode 26b disposed on the third insulating layer 53 may be spaced apart from each other. The third insulating layer 53 may electrically insulate the first contact electrode 26a and the second contact electrode 26b from each other such that the first contact electrode 26a and the second contact electrode 26b may not contact (e.g., directly contact) each other.

The first contact electrode 26a may contact the exposed partial area of the first electrode 21 with being disposed on the first inner bank 41. The second contact electrode 26b may contact the exposed partial area of the second electrode 22 with being disposed on the second inner bank 42. Each of the first contact electrode 26a and the second contact electrode 26b may transmit an electrical signal transmitted from each of the electrodes 21 and 22 to the light-emitting element 30.

The contact electrode 26 may include a conductive material. For example, the contact electrode 26 may include ITO, IZO, ITZO, aluminum (Al), etc. However, embodiments are not limited thereto.

The passivation layer 55 may be disposed on the contact electrode 26 and the third insulating layer 53. The passivation layer 55 may function to protect the members disposed on the first insulating layer 51 from an external environment.

In an example, each of the second insulating layer 52, the third insulating layer 53, and the passivation layer 55 as described above may include an inorganic insulating material or an organic insulating material. In an embodiment, each of the second insulating layer 52, the third insulating layer 53, and the passivation layer 55 may include an inorganic insulating material such as silicon oxide ($SiO_x$), silicon nitride ($SiN_x$), silicon oxynitride ($SiO_xN_y$), aluminum oxide ($Al_2O_3$), aluminum nitride (AlN), and the like. Further, each of the second insulating layer 52, the third insulating layer 53 and the passivation layer 55 may include an organic insulating material including acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, polymethyl methacrylate-polycarbonate synthetic resin, etc. However, embodiments are not limited thereto.

Referring to FIGS. 17, 18, and 19, the display device 10 according to an embodiment may be manufactured by using the inkjet printing apparatus 1 as described above with reference to FIG. 1. The inkjet printing apparatus 1 may spray the ink 90 in which the light-emitting elements 30 are dispersed. The light-emitting element 30 may be disposed between the first electrode 21 and the second electrode 22 of the display device 10.

First, as shown in FIG. 17, the first insulating layer 51, the first inner bank 41 and the second inner bank 42 spaced apart from each other and disposed on the first insulating layer 51, the first electrode 21 and the second electrode 22 respectively disposed on the first inner bank 41 and the second inner bank 42, and the second insulating material layer 52' covering the first electrode 21 and the second electrode 22 may be prepared. The second insulating material layer 52' may be patterned (e.g., partially patterned) in a subsequent process to form the second insulating layer 52 of the display device 10. The members may be formed by patterning a metal, an inorganic material, an organic material, or the like in a conventional mask process.

For example, the ink 90 in which the light-emitting elements 30 are dispersed may be sprayed on the first electrode 21 and the second electrode 22. The light-emitting element 30 may refer to the bipolar elements 95, and the ink 90, in which the light-emitting elements 30 are dispersed, may be sprayed using the inkjet printing apparatus 1 as described above and a printing method of the bipolar elements 95. For example, the inkjet printing apparatus 1 according to an embodiment may eject the ink 90 with uniformly maintaining the number of light-emitting elements 30 in the ink 90. The description thereof is the same as described above, and thus a detailed description thereof will be omitted.

As shown in FIG. 18, an electric signal is applied to the first electrode 21 and the second electrode 22 to generate the electric field IEL in the ink 90 in which the light-emitting elements 30 are dispersed. The light-emitting elements 30 may be seated or disposed between the first electrode 21 and the second electrode 22 with being subjected to the dielectrophoretic force under the electric field IEL and thus the orientation and positions thereof are changed.

As shown in FIG. 19, the process may remove the solvent 91 of the ink 90. Using the above process, the light-emitting elements 30 may be disposed between the first electrode 21 and the second electrode 22. Thereafter, the second insulating material layer 52' may be patterned to form the second insulating layer 52, the third insulating layer 53, the first contact electrode 26a and the second contact electrode 26b, and the passivation layer 55 may be formed to manufacture the display device 10.

In an example, a shape and a material of the light-emitting element 30 are not limited to FIG. 15. In some embodiments, the light-emitting element 30 may include a greater number of layers or may have other shapes.

Hereinafter, another example of the inkjet printing apparatus 1 according to an embodiment will be described. In the following example, the same components as those of the previously described embodiment have the same reference numerals, and redundant descriptions thereof will be omitted or simplified for descriptive convenience, and following descriptions will be focused on differences therebetween.

Figure 20:
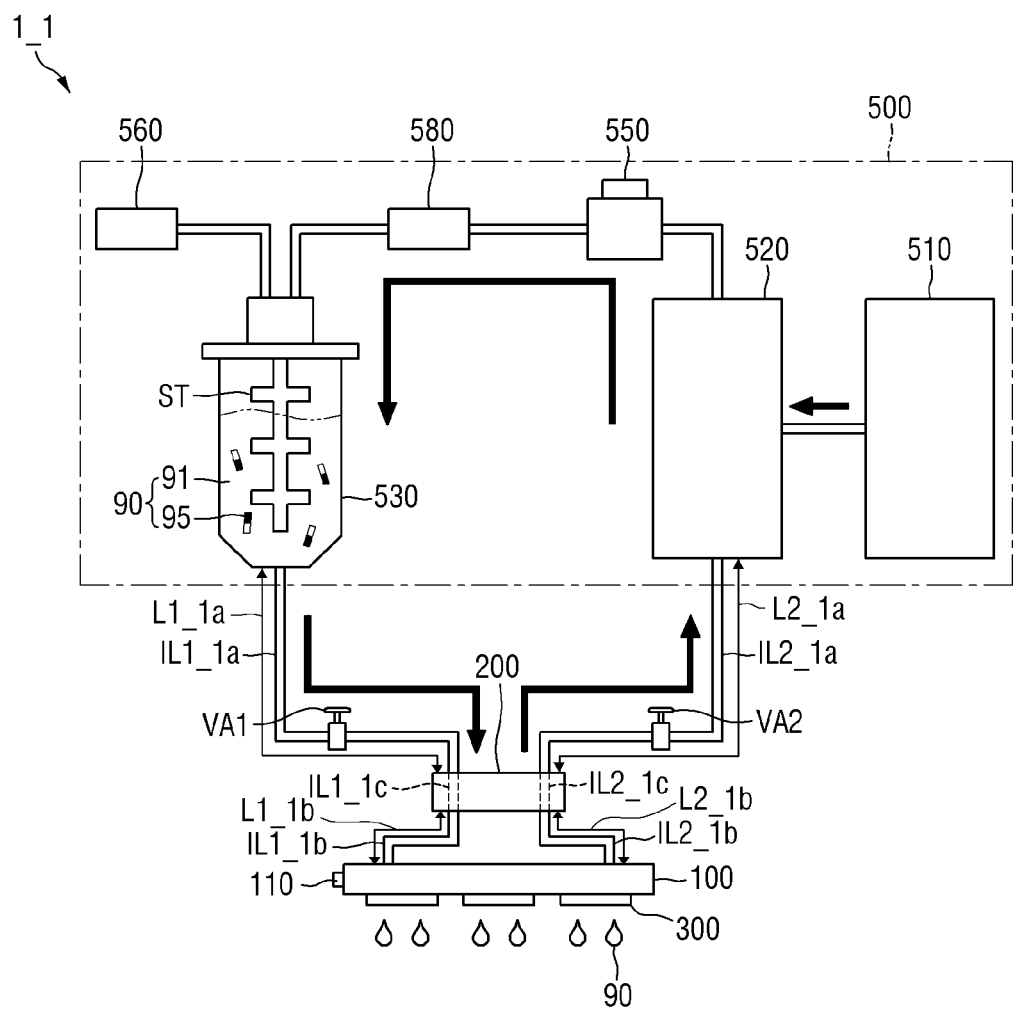
FIG. 20 is a schematic structural diagram showing a connection relationship of ink storage and an inkjet head of an inkjet printing apparatus according to another embodiment.

FIG. 20 is a schematic structural diagram showing a connection relationship between the ink storage and the inkjet head of the inkjet printing apparatus according to an embodiment.

Referring to FIG. 20, in an inkjet printing apparatus 1_1 according to an embodiment, a position of the temperature controller 200 according to an embodiment may not be biased around a center of the inkjet head 100. For example, a horizontal center of the temperature controller 200 may coincide with a horizontal center of the inkjet head 100.

A first link pipe IL1_1 according to an embodiment may include a first supplying connection portion IL1_1a, a first heat-exchange portion IL1_1c and a second supplying connection portion IL1_1b. A second link pipe IL2_1 according to an embodiment may include a first collecting connection portion IL2_1b, a second heat-exchange portion IL2_1c and a second collecting connection portion IL2_1a. The first supplying connection portion IL1_1a, the first heat-exchange portion IL1_1c, the second heat-exchange portion IL2_1c and the second collecting connection portion IL2_1a are substantially equal to as or similar to those in the detailed description of the inkjet printing apparatus 1 according to the embodiment of FIG. 4. Thus, a detailed description thereof is to be omitted for descriptive convenience.

In an example, a length L1_1b of the second supplying connection portion IL1_1b of the first link pipe IL1_1 and a length L2_1b of the first collecting connection portion IL2_1b of the second link pipe IL2_1 may be substantially equal to each other. For example, a length L1_1a of the first supplying connection portion IL1_1a of the first link pipe IL1_1 and a length L2_1a of the second collecting connection portion IL2_1a of the second link pipe IL2_1 may be substantially equal to each other. For example, the length L1_1a of the first supplying connection portion IL1_1a of the first link pipe IL1_1 may be greater than a length L1_1b of the second supplying connection portion IL1_1b thereof, and a length L2_1b of the first collecting connection portion IL2_1b of the second link pipe IL2_1 may be shorter than a length L2_1a of the second collecting connection portion IL2_1a thereof. According to this configuration, the inkjet head 100 of the inkjet printing apparatus 1_1 according to an embodiment may operate stably.

Figure 21:
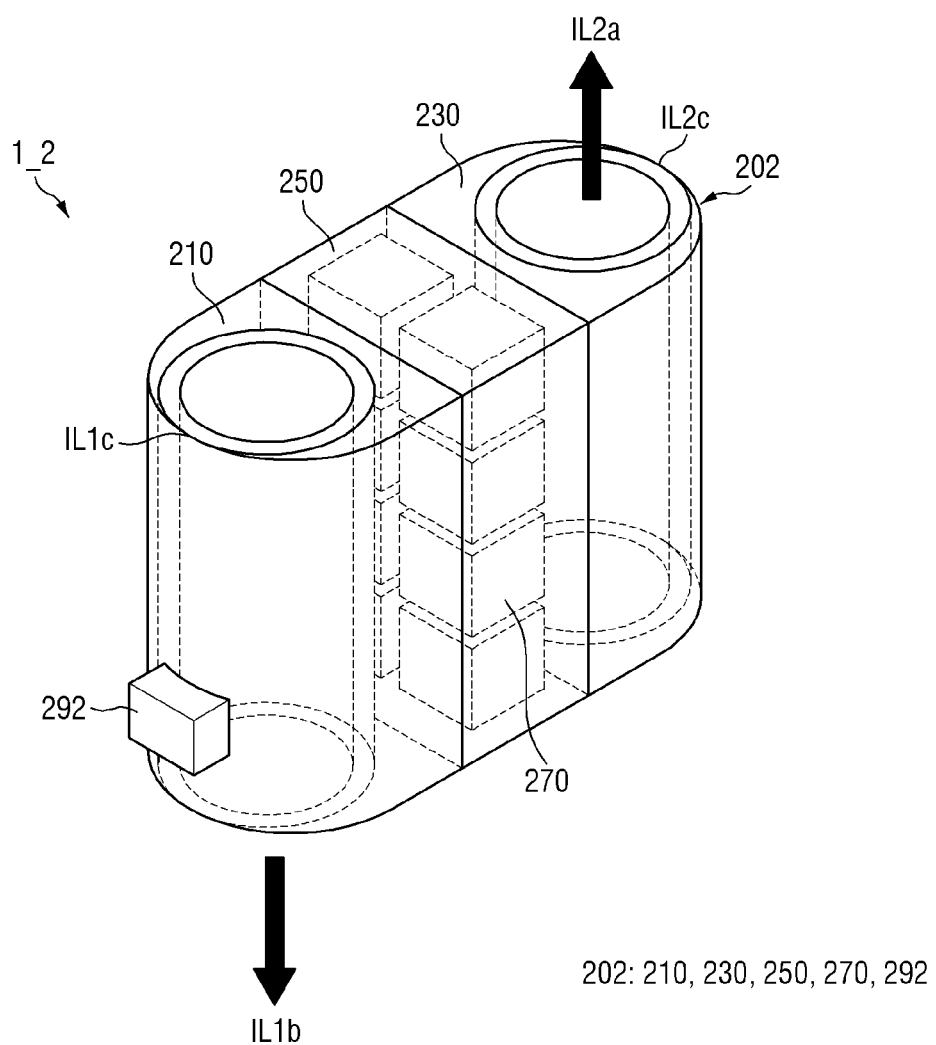
FIG. 21 is a schematic perspective view showing a temperature controller of an inkjet printing apparatus according to still another embodiment.

FIG. 21 is a schematic perspective view showing a temperature controller of an inkjet printing apparatus according to still another embodiment.

Referring to FIG. 21, a temperature controller 202 of the inkjet printing apparatus 1_2 according to an embodiment may further include a temperature measuring device 292 disposed on the heater 210. For example, the temperature measuring device 292 may measure the temperature of the ink 90 flowing to the second supplying connection portion IL1b through the first heat-exchange portion IL1c of the first link pipe IL1.

In case that the temperature of the ink 90 flowing to the second supplying connection portion IL1b is higher than a set temperature of the inkjet head 100, the temperature of the inkjet head 100 may vary based on the locations of the portions of the inkjet head 100. Thus, the droplet amounts of the ink 90 respectively ejected from the nozzles 300 may be different from each other according to the locations of the portions of the inkjet head 100.

Therefore, the temperature measuring device 292 disposed on the heater 210 may check whether the temperature of the ink 90 flowing through the first heat-exchange portion IL1c of the first link pipe IL1 to the second supplying connection portion IL1b is substantially equal to the set temperature of the inkjet head 100. Thus, based on the checking result, the temperature controller 202 may operate such that the temperature of the ink 90 flowing to the second supplying connection portion IL1b may not be higher than the set temperature of the inkjet head 100.

Figure 22:
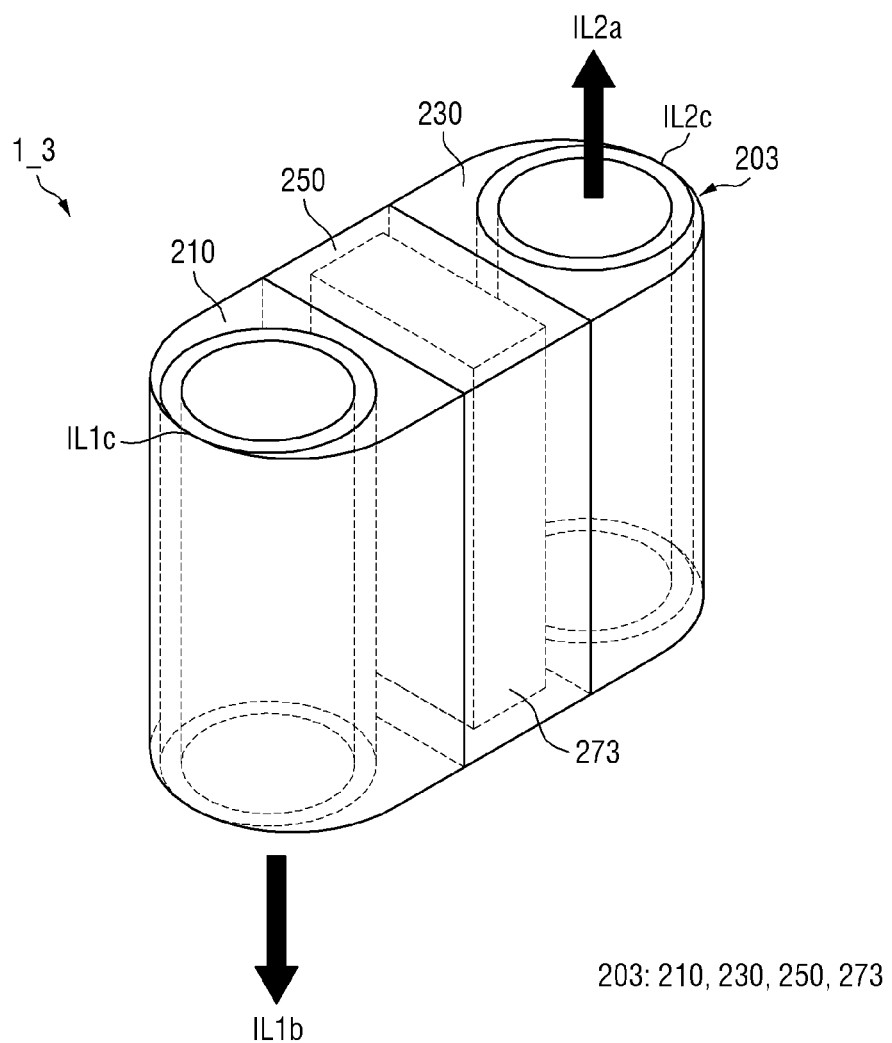
FIG. 22 is a schematic perspective view showing a temperature controller of an inkjet printing apparatus according to still yet another embodiment.
Figure 23:
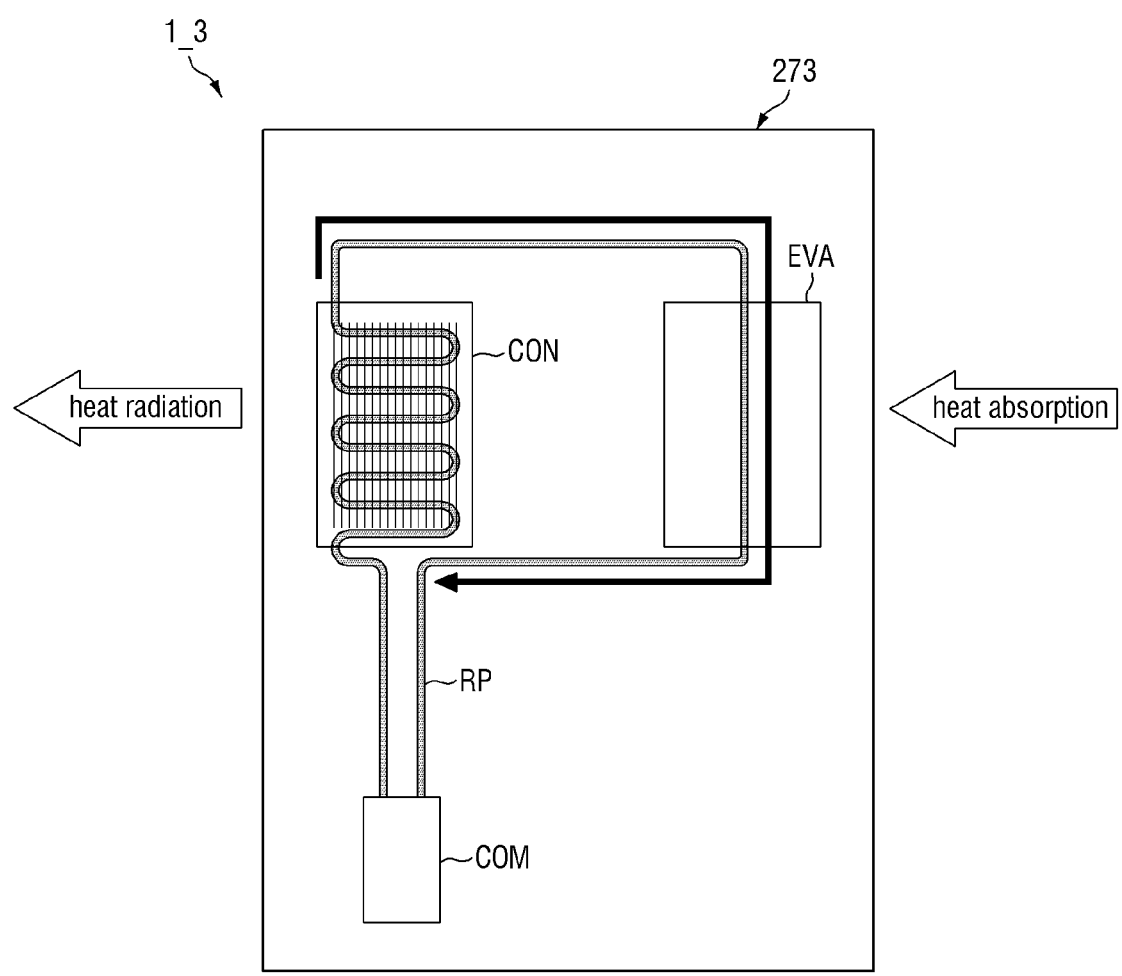
FIG. 23 is a structure diagram showing a structure of a temperature adjustment member disposed inside the temperature controller of FIG. 22.
Figure 24:
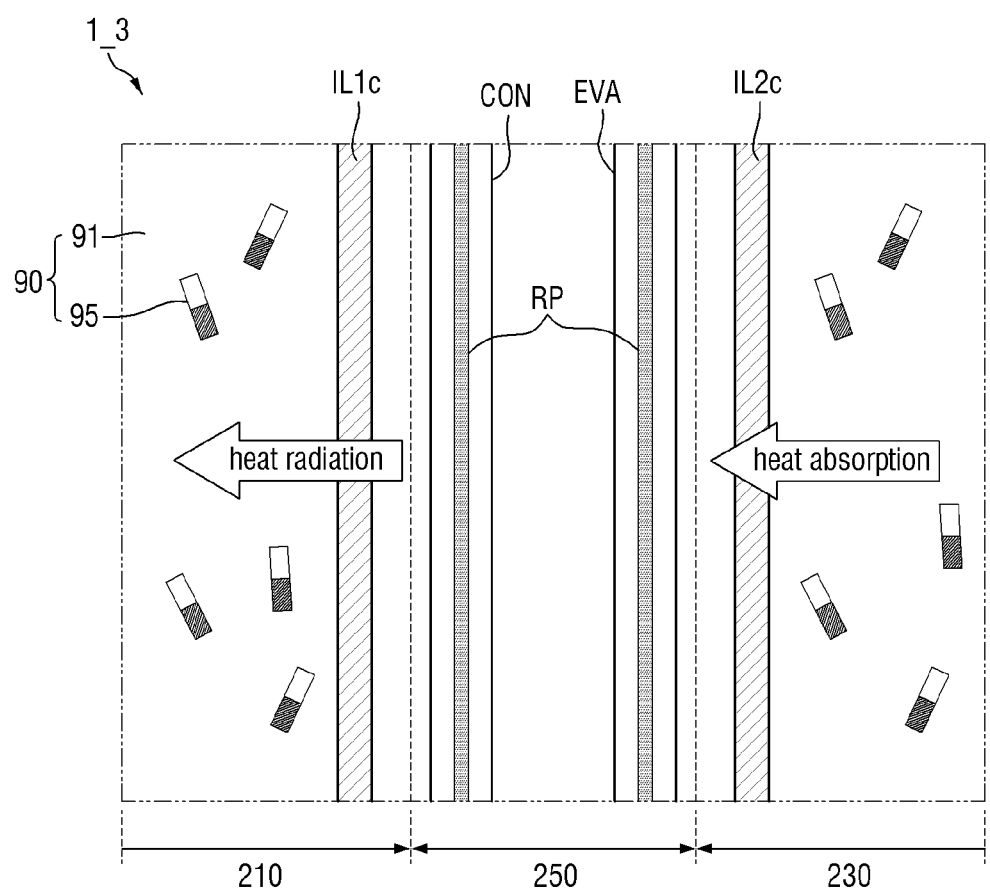
FIG. 24 is a schematic diagram to illustrate heat exchange performed in the temperature controller of FIG. 22.

FIG. 22 is a schematic perspective view showing a temperature controller of an inkjet printing apparatus according to an embodiment. FIG. 23 is a schematic structure diagram showing a structure of a temperature adjustment member disposed inside the temperature controller of FIG. 22. FIG. 24 is a schematic diagram to illustrate heat exchange performed in the temperature controller of FIG. 22.

Referring to FIGS. 22, 23, and 24, a temperature adjustment member 273 of an inkjet printing apparatus 1_3 according to an embodiment may operate by using refrigerant. For example, the temperature adjustment member 273 according to an embodiment may include a refrigerant pipe RP through which the refrigerant flows, a compressor COM, an evaporator EVA, and a condenser CON.

The refrigerant pipe RP of the temperature adjustment member 273 may be a pipe through which the refrigerant flows. The refrigerant pipe RP may extend from the compressor COM, and extend through the condenser CON and the evaporator EVA sequentially, and may return to the compressor COM.

The compressor COM of the temperature adjustment member 273 may function to compress and circulate gaseous refrigerant. The refrigerant compressed in the compressor COM may be in a high-temperature, high-pressure gaseous state, and may flow toward the condenser CON.

The condenser CON of the temperature adjustment member 273 may function to condense the refrigerant. For example, the refrigerant may be liquefied in the condenser CON such that a phase of the refrigerant may be converted to a liquid phase, such that heat from the refrigerant may be discharged to the condenser CON.

The evaporator EVA of the temperature adjustment member 273 may function to vaporize the liquefied refrigerant. For example, the refrigerant may be vaporized in the evaporator EVA such that a phase of the refrigerant may change to a gas phase. Thus, the refrigerant may absorb heat around the evaporator EVA. The refrigerant that passes through the evaporator EVA may be collected back into the compressor COM. Thus, a cooling cycle may be completed. This cycle may be repeated.

The cooler 230 of the temperature controller 203 according to an embodiment may be adjacent to the evaporator EVA of the temperature adjustment member 273, and the heater 210 of the temperature controller 203 may be adjacent to the condenser CON of the temperature adjustment member 273. Accordingly, the heat energy of the ink 90 flowing through the cooler 230 may be absorbed by the evaporator EVA to cool the ink 90. The condenser CON may emit the heat energy to the ink 90 flowing through the heater 210 to heat the ink 90.

According to the configuration as described above, the temperature controller 203 according to an embodiment may have a relatively high heat exchange efficiency. Thus, in case that a size of process equipment increases, the temperature controller may effectively control the temperature of each of the inkjet head 100 and the ink storage 500.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. An inkjet printing apparatus comprising:
   a stage that supports a substrate;
   an inkjet head disposed above the stage and that ejects a first portion of ink on the substrate, the ink including solvent and solid particles dispersed in the solvent;
   an ink storage that stores the ink;
   a first link pipe that supplies the ink from the ink storage to the inkjet head, the first link pipe fluidically connecting the ink storage and the inkjet head to each other;
   a second link pipe that collects a second portion of the ink from the inkjet head and that supplies the second portion of the ink to the ink storage, the second link pipe fluidically connecting the ink storage and the inkjet head to each other; and
   a temperature controller including:
      a housing;
      a cooler supported in a first side portion of the housing;
      a heater supported in a second side portion of the housing; and
      a temperature adjustment member that absorbs heat from the cooler and radiates at least some of the heat to the heater, the temperature adjustment member being supported in the housing between the first side portion and the second side portion, wherein
   the second portion of the ink remains in the inkjet head after the first portion of the ink is ejected from the inkjet head on the substrate,
   the first link pipe is in thermal contact with the heater of the temperature controller, and
   the second link pipe is in thermal contact with the cooler of the temperature controller.

2. The inkjet printing apparatus of claim 1, further comprising:
   an inkjet head heater that maintains a temperature of the inkjet head,
   wherein a temperature of the inkjet head is maintained at a higher temperature than a temperature of the ink storage.

3. The inkjet printing apparatus of claim 2, wherein, in a case that the ink is flowed to the inkjet head, a viscosity of the solvent of the ink received in the inkjet head via the first link pipe is lower than a viscosity of the solvent of the ink received in the ink storage via the second link pipe.

4. The inkjet printing apparatus of claim 2, wherein the first link pipe comprises:
   a first heat-exchange portion extending through the heater of the temperature controller;
   a first supplying connection portion fluidically connecting the first heat-exchange portion and the ink storage to each other; and
   a second supplying connection portion fluidically connecting the first heat-exchange portion and the inkjet head to each other, and
   in a case that the ink is flowed through the first link pipe, a temperature of the ink flowing through the first supplying connection portion is lower than a temperature of the ink flowing through the second supplying connection portion.

5. The inkjet printing apparatus of claim 4, wherein the second link pipe comprises:
   a second heat-exchange portion extending through the cooler of the temperature controller;
   a first collecting connection portion fluidically connecting the second heat-exchange portion and the inkjet head to each other; and
   a second collecting connection portion fluidically connecting the second heat-exchange portion and the ink storage to each other, and
   in a case that the second portion of the ink is flowed through the second link pipe, a temperature of the second portion of the ink flowing through the first collecting connection portion is higher than a temperature of the second portion of the ink flowing through the second collecting connection portion.

6. The inkjet printing apparatus of claim 5, wherein the temperature controller further comprises a temperature measuring member that, in the case that the ink is flowed through the first link pipe, measures the temperature of the ink flowing through the first heat-exchange portion, and
   the heater of the temperature controller adjusts the temperature of the ink flowing through the first heat-exchange portion based on a setpoint temperature of the inkjet head and an output of the temperature measuring member.

7. The inkjet printing apparatus of claim 6, wherein, in the case that the ink is flowed through the first link pipe and the case that the second portion of the ink is flowed through the second link pipe, the temperature of the ink flowing through the second supplying connection portion of the first link pipe, the temperature of the second portion of the ink flowing through the first collecting connection portion of the second link pipe, and a temperature of the ink flowing through the inkjet head are maintained to be substantially equal to each other.

8. The inkjet printing apparatus of claim 7, wherein, in the case that the ink is flowed through the first link pipe and the case that the second portion of the ink is flowed through the second link pipe, a viscosity of the solvent of the ink flowing through the second supplying connection portion of the first link pipe, a viscosity of the solvent of the second portion of the ink flowing through the first collecting connection portion of the second link pipe, and a viscosity of the solvent of the ink flowing through the inkjet head are substantially equal to each other.

9. The inkjet printing apparatus of claim 1, wherein the temperature controller further comprises a heat source that supplies heat the heater, the heat source being supported in the housing between the first side portion and the second side portion, and
   the temperature adjustment member is disposed on the heat source and, in a case that heat is absorbed by the temperature adjustment member from the cooler, the temperature adjustment member supplies the at least some of the heat to the heat source.

10. The inkjet printing apparatus of claim 9, wherein the temperature adjustment member comprises:
    a cooling plate;
    a heating plate facing away from the cooling plate;
    a first connection electrode disposed between the cooling plate and the heating plate and being in thermal contact with the cooling plate;
    a second connection electrode disposed between the cooling plate and the heating plate and being in thermal contact with the heating plate;
    a P-type thermoelectric semiconductor element disposed between the first connection electrode and the second connection electrode, the P-type thermoelectric semiconductor element electrically connecting the first connection electrode and the second connection electrode to each other; and
    an N-type thermoelectric semiconductor element disposed between the first connection electrode and the second connection electrode and spaced apart from the P-type thermoelectric semiconductor element, the N-type thermoelectric semiconductor element electrically connecting the first connection electrode and the second connection electrode to each other.

11. The inkjet printing apparatus of claim 10, wherein the cooling plate of the temperature adjustment member is closer to the cooler of the temperature controller than the heater of the temperature controller, and
    the heating plate of the temperature adjustment member is closer to the heater of the temperature controller than the cooler of the temperature controller.

12. The inkjet printing apparatus of claim 9, wherein the temperature adjustment member comprises:
    refrigerant;
    a flow path that flows the refrigerant;
    a compressor that compresses the refrigerant;
    an evaporator that evaporates the refrigerant; and
    a condenser that condenses the refrigerant.

13. The inkjet printing apparatus of claim 12, wherein the evaporator of the temperature adjustment member is closer to the cooler of the temperature controller than the heater of the temperature controller, and
    the condenser of the temperature adjustment member is closer to the heater of the temperature controller than the cooler of the temperature controller.

14. An inkjet printing apparatus comprising:
    a stage that supports a substrate;
    an inkjet head disposed above the stage and that ejects a first portion of ink on the substrate, the ink including solvent and bipolar light emitting elements dispersed in the solvent;
    an ink storage that stores the ink;
    a temperature controller spaced apart from both the inkjet head and the ink storage;
    a first link pipe that supplies the ink from the ink storage to the inkjet head, the first link pipe extending through a first side portion of the temperature controller and fluidically connecting the ink storage and the inkjet head to each other; and a second link pipe that collects a second portion of the ink from the inkjet head and that supplies the second portion of the ink to the ink storage, the second link pipe extending through a second side portion of the temperature controller and fluidically connecting the ink storage and the inkjet head to each other, the second side portion of the temperature controller opposing the first side portion of the temperature controller, wherein the second portion of the ink remains in the inkjet head after the first portion of the ink is ejected from the inkjet head on the substrate.

15. The inkjet printing apparatus of claim 14, wherein the temperature controller is disposed closer to the inkjet head than to the ink storage.

16. The inkjet printing apparatus of claim 15, wherein the first link pipe comprises:
    a first heat-exchange portion extending through the first side portion of the temperature controller;
    a first supplying connection portion fluidically connecting the first heat-exchange portion and the ink storage to each other; and
    a second supplying connection portion fluidically connecting the first heat-exchange portion and the inkjet head to each other, and
    a length of the first supplying connection portion is longer than a length of the second supplying connection portion.

17. The inkjet printing apparatus of claim 16, wherein the second link pipe comprises:
    a second heat-exchange portion extending through the second side portion of the temperature controller;
    a first collecting connection portion fluidically connecting the second heat-exchange portion and the inkjet head to each other; and
    a second collecting connection portion fluidically connecting the second heat-exchange portion and the ink storage to each other, and
    a length of the second collecting connection portion is longer than a length of the first collecting connection portion.

18. The inkjet printing apparatus of claim 17, wherein the first side portion of the temperature controller functions to increase the temperature of the ink, the second side portion of the temperature controller functions to decrease the temperature of the ink, and
    a length of the second supplying connection portion is shorter than a length of the first collecting connection portion.

19. The inkjet printing apparatus of claim 18, wherein the temperature controller comprises:
    a cooling plate forming a section of the second side portion of the temperature controller;
    a heating plate forming a section of the first side portion of the temperature controller, the heating plate facing away from the cooling plate;
    a first connection electrode disposed between the cooling plate and the heating plate, the first connection electrode being in thermal contact with the cooling plate;
    a second connection electrode disposed between the cooling plate and the heating plate, the second connection electrode being in thermal contact with the heating plate;
    a P-type thermoelectric semiconductor element disposed between the first connection electrode and the second connection electrode, the P-type thermoelectric semiconductor element electrically connecting the first connection electrode and the second connection electrode to each other; and
    an N-type thermoelectric semiconductor element disposed between the first connection electrode and the second connection electrode, and spaced apart from the P-type thermoelectric semiconductor element, the N-type thermoelectric semiconductor element electrically connecting the first connection electrode and the second connection electrode to each other.

20. The inkjet printing apparatus of claim 18, wherein the temperature controller comprises:
    refrigerant;
    a flow path that flows the refrigerant;
    a compressor that compresses the refrigerant;
    a condenser forming a section of the first side portion of the temperature controller and that condenses the compressed refrigerant from the compressor; and
    an evaporator forming a section of the second side portion of the temperature controller and that evaporates the condensed refrigerant from the condenser.

* * * * *